(12) United States Patent
Wu et al.

(10) Patent No.: US 9,306,117 B2
(45) Date of Patent: Apr. 5, 2016

(54) TRANSFER-BONDING METHOD FOR LIGHT EMITTING DEVICES

(71) Applicant: Industrial Technology Research Institute, Hsinchu (TW)

(72) Inventors: Ming-Hsien Wu, Tainan (TW);
Ying-Chien Chu, Tainan (TW);
Shih-Hao Wang, Taichung (TW);
Yen-Hsiang Fang, New Taipei (TW);
Mu-Tao Chu, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 14/583,594

(22) Filed: Dec. 27, 2014

(65) Prior Publication Data
US 2015/0111329 A1    Apr. 23, 2015

Related U.S. Application Data

(63) Continuation-in-part of application No. 13/557,231, filed on Jul. 25, 2012.

(60) Provisional application No. 61/511,137, filed on Jul. 25, 2011.

(30) Foreign Application Priority Data

May 25, 2012  (TW) .............................. 101118745 A

(51) Int. Cl.
*H01L 21/00*    (2006.01)
*H01L 33/00*    (2010.01)
(Continued)

(52) U.S. Cl.
CPC ........ *H01L 33/0095* (2013.01); *H01L 25/0753* (2013.01); *H01L 27/153* (2013.01); *H01L 33/44* (2013.01); *H01L 33/58* (2013.01); *H01L 2224/95* (2013.01); *H01L 2924/0002* (2013.01)

(58) Field of Classification Search
CPC ............ H01L 33/0095; H01L 25/0753; H01L 27/153
USPC .......................... 257/89, E33.001; 438/34, 35
See application file for complete search history.

(56) References Cited

U.S. PATENT DOCUMENTS 5,994,722 A    11/1999  Averbeck et al.
6,613,610 B2    9/2003  Iwafuchi et al.
(Continued)

FOREIGN PATENT DOCUMENTS

CN    101197355    6/2008
CN    101202319    6/2008
(Continued)

OTHER PUBLICATIONS

Office Action of US Counterpart Application, issued on Apr. 20, 2015, p. 1-p. 16, in which the listed references were cited.
(Continued)

*Primary Examiner* — Robert Huber
(74) *Attorney, Agent, or Firm* — Jianq Chyun IP Office

(57) ABSTRACT

A transfer-bonding method for light emitting devices including following steps is provided. A plurality of light emitting devices is formed over a first substrate and is arranged in array, wherein each of the light emitting devices includes a device layer and an interlayer sandwiched between the device layer and the first substrate. A protective layer is formed over the first substrate to selectively cover parts of the light emitting devices, and other parts of the light emitting devices are uncovered by the protective layer. The device layers uncovered by the protective layer are bonded with a second substrate. The interlayers uncovered by the protective layer are removed, so that parts of the device layers uncovered by the protective layer are separated from the first substrate and are transfer-bonded to the second substrate.

17 Claims, 27 Drawing Sheets

(51) Int. Cl.
*H01L 27/15* (2006.01)
*H01L 25/075* (2006.01)
*H01L 33/44* (2010.01)
*H01L 33/58* (2010.01)

(56) References Cited

U.S. PATENT DOCUMENTS

| | | | |
|---|---|---|---|
| 6,730,979 | B2 | 5/2004 | Boisvert |
| 6,863,584 | B2 | 3/2005 | Natori |
| 6,872,635 | B2 | 3/2005 | Hayashi et al. |
| 6,913,985 | B2 | 7/2005 | Ogihara et al. |
| 6,972,204 | B2 | 12/2005 | Oohata et al. |
| 7,408,566 | B2 | 8/2008 | Ogihara et al. |
| 8,617,927 | B1 * | 12/2013 | Margomenos et al. ....... 438/112 |
| 2003/0087476 | A1 | 5/2003 | Oohata et al. |
| 2006/0024855 | A1 | 2/2006 | Sano |
| 2006/0094166 | A1 | 5/2006 | Kim et al. |
| 2008/0224153 | A1 | 9/2008 | Tomoda |
| 2008/0274571 | A1 | 11/2008 | Ogihara et al. |
| 2009/0114931 | A1 | 5/2009 | Hsueh et al. |
| 2009/0239361 | A1 | 9/2009 | Igari et al. |
| 2010/0317132 | A1 | 12/2010 | Rogers et al. |
| 2014/0340900 | A1 * | 11/2014 | Bathurst et al. .......... 362/249.02 |

FOREIGN PATENT DOCUMENTS

| | | |
|---|---|---|
| CN | 101452928 | 6/2009 |
| CN | 101740697 | 6/2010 |
| CN | 101964385 | 2/2011 |
| JP | 10-200166 | 7/1998 |
| JP | 2009-076562 | 4/2009 |
| TW | 486803 | 5/2002 |
| TW | I232505 | 5/2005 |
| TW | 200921895 | 5/2009 |
| TW | I319239 | 1/2010 |
| TW | 201122708 | 7/2011 |
| WO | 2010100882 | 9/2010 |
| WO | 2010149027 | 12/2010 |

OTHER PUBLICATIONS

Fan et al., "III-nitride micro-emitter arrays: development and applications," Journal of Physics D: Applied Physics 41, Apr. 4, 2008, pp. 1-12.

Gong et al., "Flip-chip, micro-pixellated InGaN light-emitting diode arrays: attractive sources for micro-displays, colour conversion, and fluorescence detection," Phys. Status Solidi C 6 (S2), Jan. 19, 2009, pp. S848-S851.

Park et al., "Printed Assemblies of Inorganic Light-Emitting Diodes for Deformable and Semitransparent Displays," Science 325, Aug. 21, 2009, pp. 977-981.

Shin et al., "Integration of Micro-Light-Emitting-Diode Arrays and Silicon Driver for Heterogeneous Optoelectronic Integrated Circuit Device," Japanese Journal of Applied Physics 50, Apr. 20, 2011, pp. 04DG12-1-04DG12-4.

Zhaojun Liu, "III-nitride Based Light Emitting Diodes on Silicon (LEDoS) Displays", Abstract of PhD Thesis Presentation, Nov. 24, 2010, p. 1-1.

Office Action of U.S. Appl. No. 13/557,231, issued on Sep. 16, 2015, p. 1-p. 18.

* cited by examiner

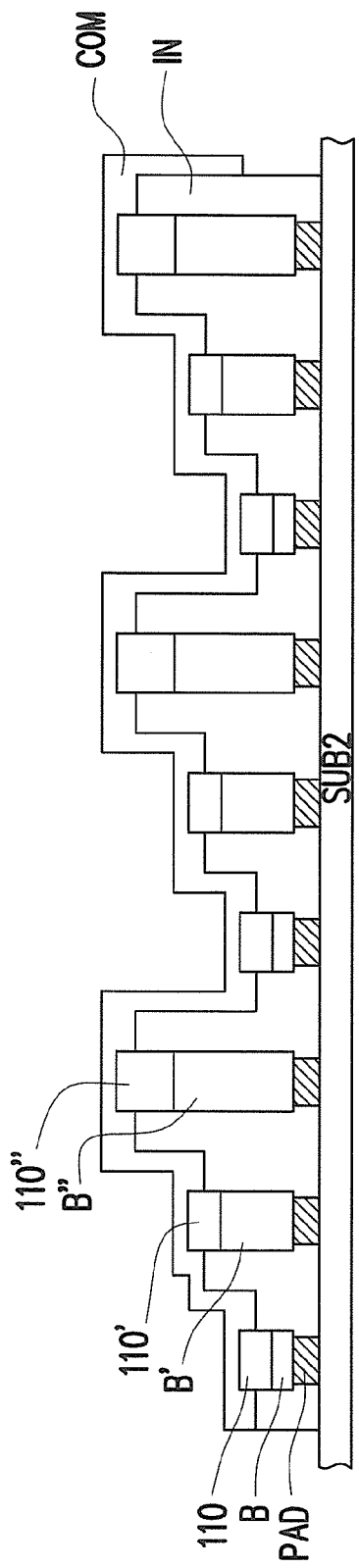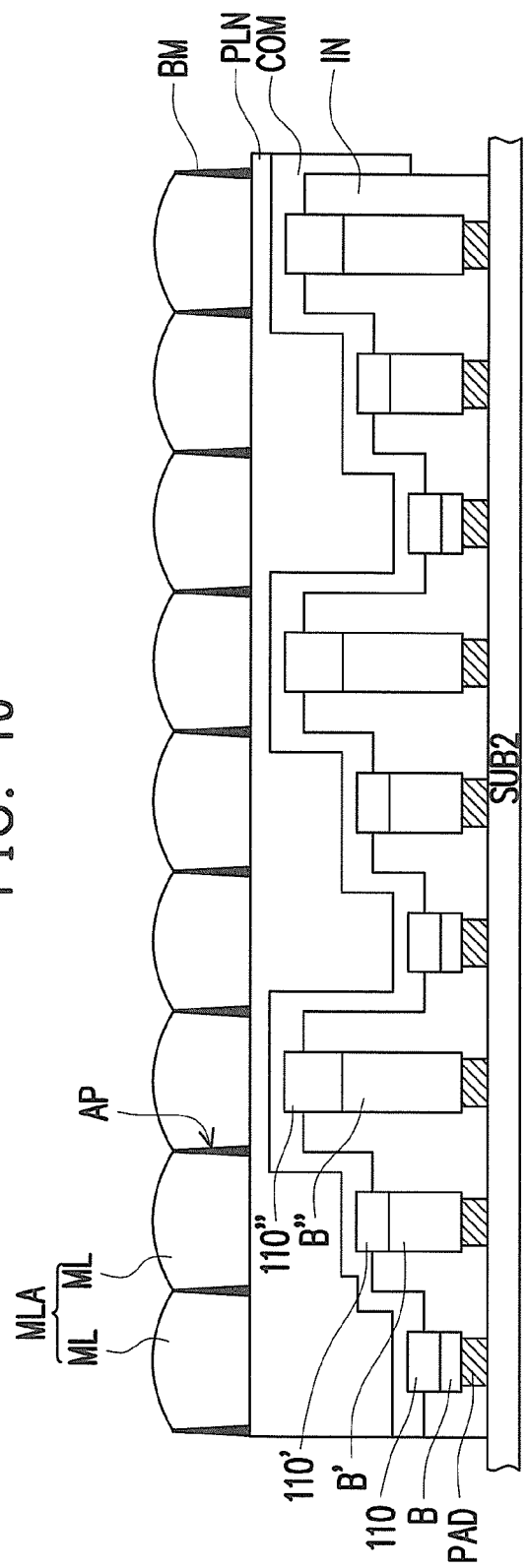

FIG. 9A"

TRANSFER-BONDING METHOD FOR LIGHT EMITTING DEVICES

CROSS-REFERENCE TO RELATED APPLICATION

This application is a continuation-in-part of a prior U.S. application Ser. No. 13/557,231, filed Jul. 25, 2012, which claims the priority benefits of U.S. provisional application Ser. No. 61/511,137, filed on Jul. 25, 2011 and Taiwan application serial no. 101118745, filed on May 25, 2012. The entirety of each of the above-mentioned patent applications is hereby incorporated by reference herein and made a part of this specification.

TECHNICAL FIELD

The technical field relates to a transfer-bonding method for photoelectrical devices.

BACKGROUND

Inorganic light emitting diode display has features of self-luminous, high brightness and so on, and therefore has been widely applied in the fields of illumination, display and so forth monolithic micro-display has been faced with a bottleneck of colorizing technology. Generally, technology utilizing an epitaxial technique in a single light emitting diode chip to manufacture a plurality of light emitting layers capable of emitting different colored lights has already been provided, such that the single light emitting diode chip can provide different colored lights. Because lattice constants of the light emitting layers capable of emitting different colored lights are different, growth of the light emitting layers on a same substrate is difficult. In addition, another addition, another technology has provided a colorizing technique utilizing a light emitting diode chip in collocation with different color conversion materials, but this technology is still facing problems of low conversion efficiency of the color conversion materials, coating uniformity and so forth.

The transfer-bonding technique of the light emitting diode has a better chance to enhance brightness and display quality of a monolithic micro-display rapidly and efficiently transfer-bonding the light emitting diode to a circuit substrate of the monolithic micro-display is in fact one of the recently concerned issues of industry.

SUMMARY

One of exemplary embodiments provides a transfer-bonding method for light emitting devices.

One of exemplary embodiments provides a transfer-bonding method for light emitting devices comprising: providing a first substrate having an elastic interlayer formed thereon; forming a plurality of light emitting devices arranged in array over the elastic interlayer; providing a second substrate having a mask layer formed thereon, wherein an area of the second substrate is exposed by the mask layer; bonding the first substrate and the second substrate, such that parts of the device layers are bonded with the area of the second substrate exposed by the mask layer and the light emitting devices are pressed and embedded in the elastic interlayer by the second substrate; and separating the elastic interlayer from the parts of the device layers bonded with the second substrate, such that the parts of the device layers are transfer-bonded to the second substrate.

Several exemplary embodiments accompanied with figures are described in detail below to further describe the disclosure in details.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

FIG. 1A to FIG. 1K are schematic flow chat diagrams illustrating a transfer-bonding method for light emitting devices according to a first embodiment.

FIG. 1B', FIG. 1E' and FIG. 1H' schematically illustrate another type of protective layers (PV1, PV2 and PV3) according to the first embodiment.

DETAILED DESCRIPTION OF DISCLOSED EMBODIMENTS

First Embodiment

Figure 1A:
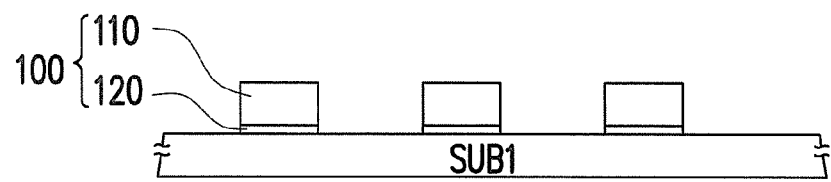

FIG. 1A to FIG. 1K are schematic flow chat diagrams illustrating a transfer-bonding method for light emitting devices according to a first embodiment. Referring to FIG. 1A, a plurality of light emitting devices 100 is formed over a first substrate SUB1 and are arranged in array, wherein each of the light emitting devices 100 includes a device layer 110 and a sacrificial pattern 120 sandwiched between the device layer 110 and the first substrate SUB1. In present embodiment, the device layers 110 located over the same first substrate SUB1 are suitable for emitting same colored lights. For example, the device layers 110 formed over the first substrate SUB1 are red light emitting diodes, green light emitting diodes or blue light emitting diodes. In addition, every device layer 110 has already included an electrode (not shown). The size of each device layer 110 is about 1 micro-meter to about 100 micro-meters. The pitch between two adjacent device layers 110 can be adjusted according to actual product requirements (as shown in the following Table 1).

TABLE 1

| Application Filed | Panel Size (inch) | Panel Resolution | Pitch of μ LED (μm) | Brightness of Panel (nits) |
|---|---|---|---|---|
| Display panel for HMD Module | 0.2~0.3 | 640 × 360<br>960 × 540<br>1280 × 720<br>1920 × 1080 | 6.9~10.4<br>4.6~6.9<br>3.5~5.2<br>2.3~3.5 | 1000~5000 |
| Display panel | 4.0~10.0 | 1280 × 720 | 69.2~173.0 | 300~1000 |

TABLE 1-continued

| Application Filed | Panel Size (inch) | Panel Resolution | Pitch of μ LED (μm) | Brightness of Panel (nits) |
|---|---|---|---|---|
| for smartphone/ Tablet | 0.8~2.0 | 1920 × 1080<br>3840 × 2160<br>240 × 240<br>360 × 360<br>480 × 480<br>640 × 640 | 46.1~115.3<br>23.1~57.7<br>59.9~149.7<br>39.9~99.8<br>29.9~74.8<br>22.5~56.1 | 300~1000 |
| Display panel for Smart watch | | | | |
| Display panel for indoor display apparatus | 12~70 | 1920 × 1080<br>3840 × 2160 | 138.4~807.1<br>69.2~403.6 | 200~500 |
| Display panel for outdoor display apparatus | 80~150 | 1920 × 1080<br>3840 × 2160 | 922.4~1383.6<br>461.2~691.8 | 1000~5000 |

Figure 1B:
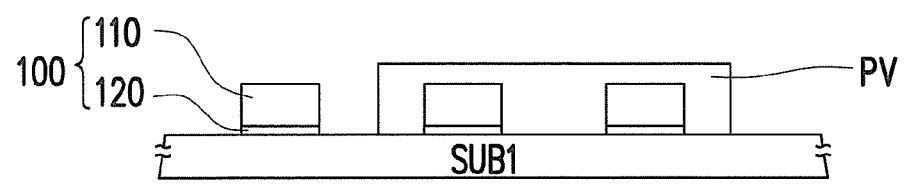

Referring to FIG. 1B, a protective layer PV is formed over the first substrate SUB1 to selectively cover parts of the light emitting devices 100, while other parts of the light emitting devices 100 are uncovered by the protective layer PV. In the present embodiment, the protective layer PV is, for example, a photoresist material or other dielectric material, such that the light emitting devices 100 covered by the protective layer PV, in a subsequent removal process of the sacrificial patterns 120, is not separated from the first substrate SUB1. For example, a material of the protective layer PV may be a polyimide or other polymer material, and the material of the protective layer PV may also be a silicon oxide (SiOx), a silicon nitride (SiNx) or other inorganic dielectric material. As shown in FIG. 1B, parts of the device layers 110 and the sacrificial patterns 120 underneath are entirely covered or encapsulated by the protective layer PV, for example. In another embodiment, as shown in FIG. 1B', the protective layer PV1 merely covers or encapsulates side surfaces of the parts of the device layers 110 and the sacrificial patterns 120 underneath. In other words, the parts of the device layers 110 and the sacrificial patterns 120 underneath are partially covered or encapsulated by the protective layer PV1.

Figure 1C:
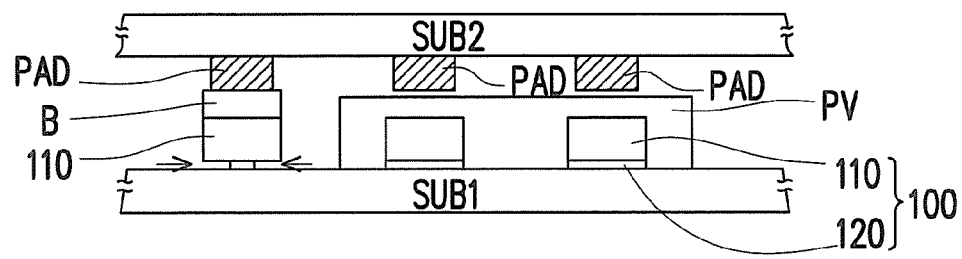
Figure 1D:
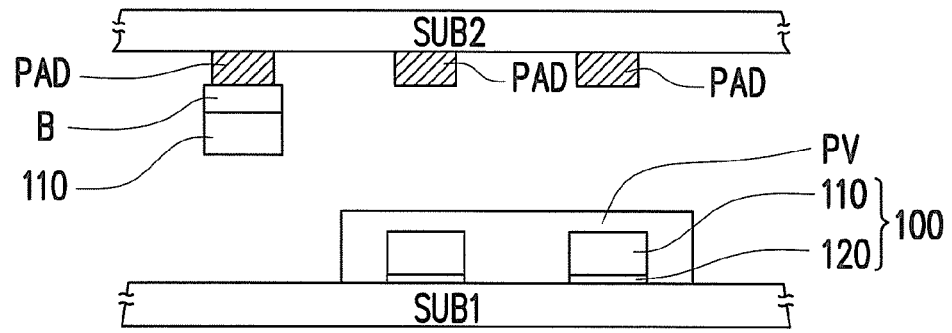

Referring to FIG. 1C and FIG. 1D, the device layers 110 uncovered by the protective layer PV are bonded with a second substrate SUB2, and the sacrificial patterns 120 (as shown in FIG. 1C) uncovered by the protective layer PV are removed, so that parts of the device layers 110 are separated from the first substrate SUB1 and are transfer-bonded to the second substrate SUB2 (as shown in FIG. 1D). In the present embodiment, the second substrate SUB2 is, for example, a circuit substrate (e.g., a complementary metal oxide semiconductor chip having a plurality of bonding pads PAD) in a monolithic micro-display, and the device layers 110 uncovered by the protective layer PV are bonded with the bonding pads PAD over the second substrate SUB2 through conductive bumps B. For example, the conductive bumps B are gold bumps or other alloy bumps, and the bonding (electrical connection) between the conductive bumps B and the bonding pads PAD over the second substrate SUB2 are achieved through reflow or other soldering process. As shown in FIG. 1C, the bumps B are selectively formed on parts of the device layers 110 uncovered by the protective layer PV. The bumps B are formed on parts of the device layers 110 after the formation of the protective layer PV.

As shown in FIG. 1C, during a process of bonding the conductive bumps B and the bonding pads PAD, the protective layer PV is able to effectively and directly control a distance between the first substrate SUB1 and the second substrate SUB2, so as to avoid a phenomena of excessive press fit. In other words, the protective layer PV provides a function of bonding stop and thus a process control is much easier.

In this embodiment, the removal process of the sacrificial pattern is, for example, wet etch. A choice of etchant is related to the material of the protective layer PV, an etching rate of the chosen etchant on the sacrificial pattern 120 has to be higher than an etching rate on the protective layer PV, so as to ensure the device layers 110 and the sacrificial patterns 120 covered by the protective layer PV are not to be damaged by the etchant.

FIG. 1A to FIG. 1D have briefly illustrated a process of transfer-bonding the light emitting devices 100 from the first substrate SUB1 to the second substrate SUB2. In order to transfer-bond a plurality of device layers suitable for emitting different colored lights to the second substrate SUB2, the manufacturing process steps illustrated in FIG. 1E to FIG. 1K are performed.

Figure 1E:
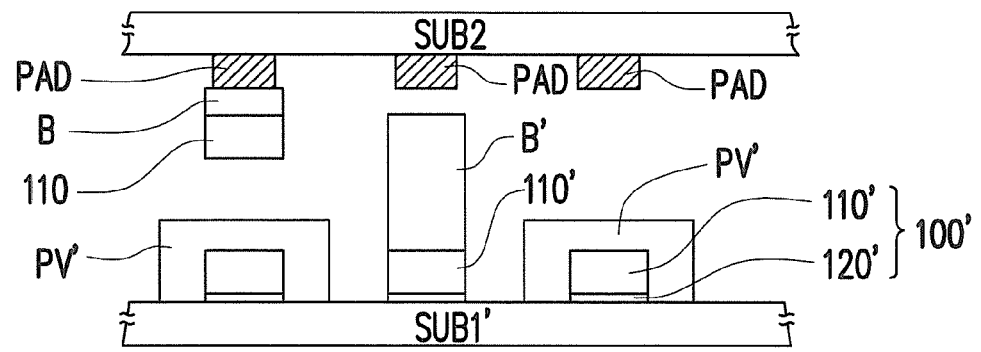

Referring to FIG. 1E, a plurality of light emitting devices 100' arranged in array are formed over another first substrate SUB1', wherein each of the light emitting device 100' includes a device layer 110' and a sacrificial pattern 120' sandwiched between the device layer 110' and the first substrate SUB1'. In the present embodiment, device layers 110' located over the first substrate SUB1' are suitable for emitting same colored lights. For example, the device layers 110' over the first substrate SUB1' all are red light emitting diodes, green light emitting diodes or blue light emitting diodes. The device layer 110' and the device layers 110 are suitable for respectively emitting different colors of light. The size of each device layer 110' is about 1 micro-meter to about 100 micro-meters. The pitch between two adjacent device layers 110' can be adjusted according to actual product requirements (e.g., panel size or resolution).

As shown in FIG. 1E, a protective layer PV' is formed over the first substrate SUB1' to selectively cover parts of the light emitting devices 100', while other parts of the light emitting devices 100' are uncovered by the protective layer PV'. The protective layer PV' in FIG. 1E has the same function as the protective layer PV in FIG. 1B, and thus is not repeated herein. As shown in FIG. 1E, parts of device layers 110' and the sacrificial pattern 120' underneath are entirely covered or encapsulated by the protective layer PV', for example. In another embodiment, as shown in FIG. 1E', the protective layer PV2 merely covers or encapsulates side surfaces of the parts of the device layers 110' and the sacrificial pattern 120' underneath. In other words, the parts of the device layers 110' and the sacrificial pattern 120' underneath are partially covered or encapsulated by the protective layer PV2.

Figure 1F:
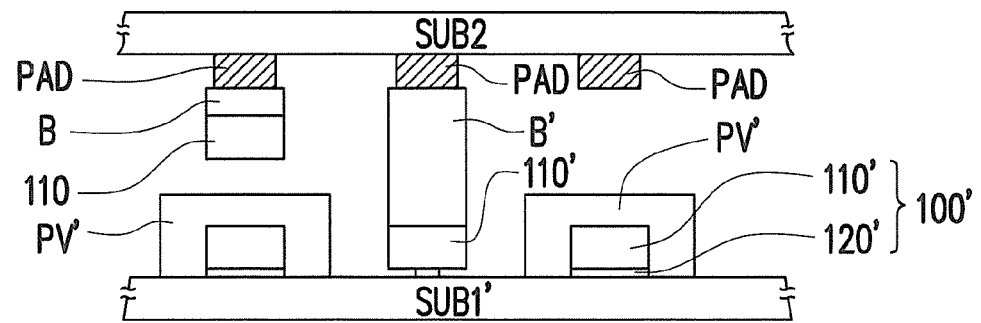
Figure 1G:
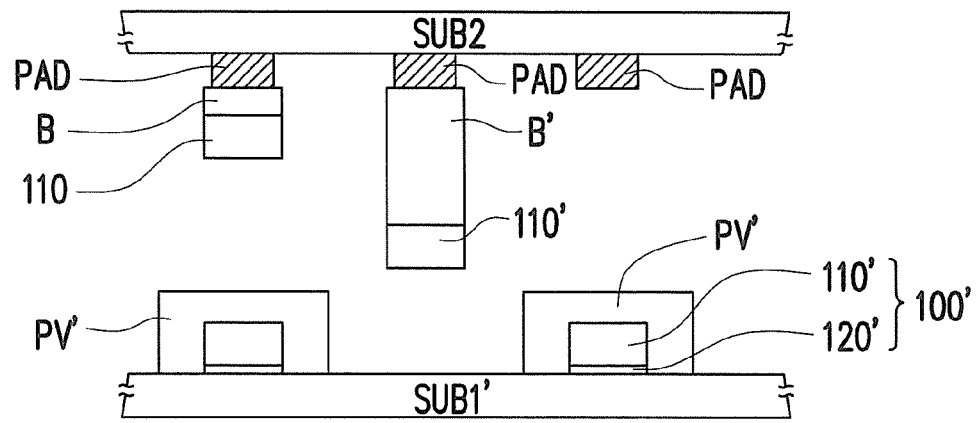

Referring to FIG. 1F and FIG. 1G, the device layers 110' uncovered the by protective layer PV' are bonded with a second substrate SUB2, and the sacrificial patterns 120' (as shown in FIG. 1F) uncovered by the protective layer PV' are removed, so that parts of the device layers 110' are separated from the first substrate SUB1' and are transfer-bonded to the second substrate SUB2 (as shown in FIG. 1G). In the present embodiment, the device layers 110' uncovered by the protective layer PV' is, for example, bonded with a plurality of bonding pads PAD over the second substrate SUB2 through a plurality of conductive bumps B'. For example, the conductive bumps B' are gold bumps or other alloy bumps, and the bonding (electrical connection) between the conductive bumps B' and the bonding pads PAD over the second substrate SUB2 are achieved through reflow or other soldering process.

Figure 1H:
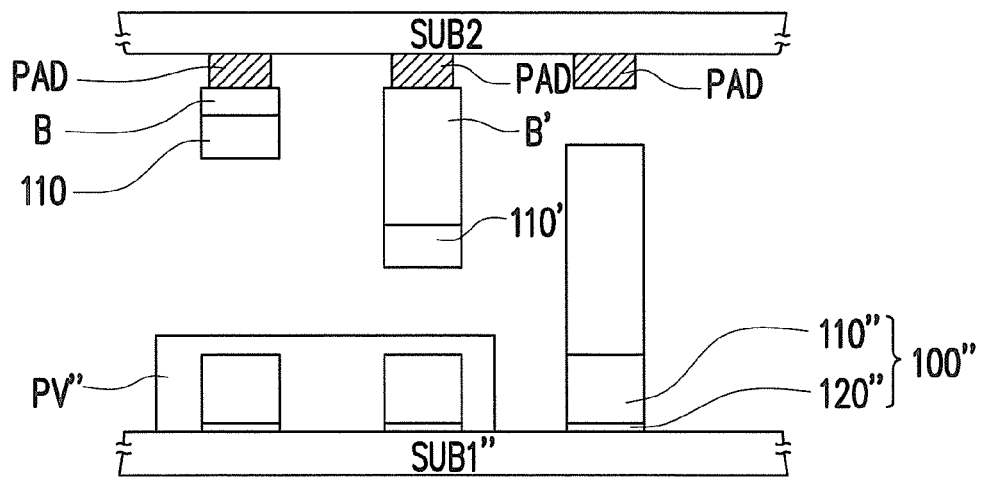

Referring to FIG. 1H, a plurality of light emitting devices 100" arranged in array is formed over another first substrate SUB1", wherein each of the light emitting devices 100"

includes a device layer 110" and a sacrificial pattern 120" sandwiched between the device layer 110" and the first substrate SUB1". In the present embodiment, the device layers 110" located over the same first substrate SUB1" are suitable for emitting same colored lights. For example, the device layer 110" over the first substrate SUB1" all are red light emitting diodes, green light emitting diodes or blue light emitting diodes. The device layers 110", the device layers 110' and the device layers 110 are suitable for respectively emitting different colors of light. The size of each device layer 110" is about 1 micro-meter to about 100 micro-meters. The pitch between two adjacent device layers 110" can be adjusted according to actual product requirements (e.g., panel size or resolution).

As shown in FIG. 1H, a protective layer PV" is formed on the first substrate SUB1" to selectively cover parts of the light emitting devices 100", while other parts of the light emitting devices 100" are uncovered by the protective layer PV". The protective layer PV" in FIG. 1E is has the same function as the protective layer PV in FIG. 1B, and thus is not repeated herein. As shown in FIG. 1H, parts of the device layers 110" and the sacrificial pattern 120" underneath are entirely covered or encapsulated by the protective layer PV", for example. In another embodiment, as shown in FIG. 1H', the protective layer PV3 merely covers or encapsulates side surfaces of the parts of the device layers 110" and the sacrificial pattern 120" underneath. In other words, the parts of the device layers 110" and the sacrificial pattern 120" underneath are partially covered or encapsulated by the protective layer PV3.

Figure 1I:
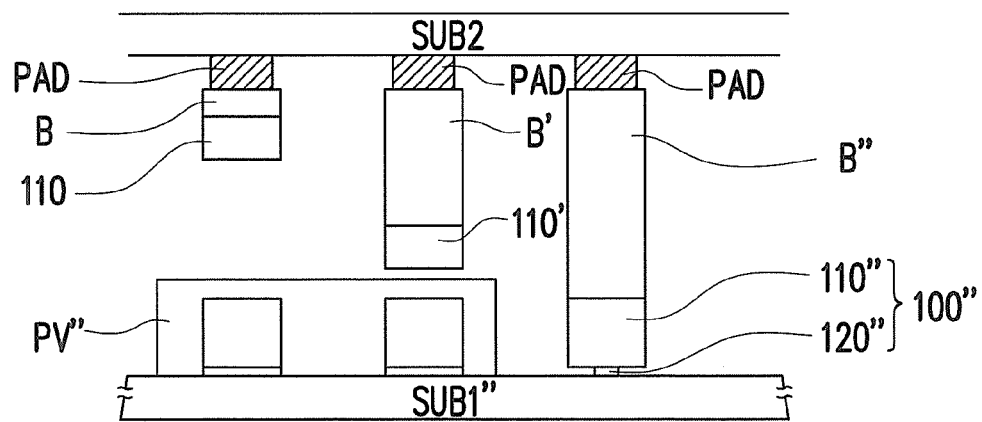
Figure 1B:
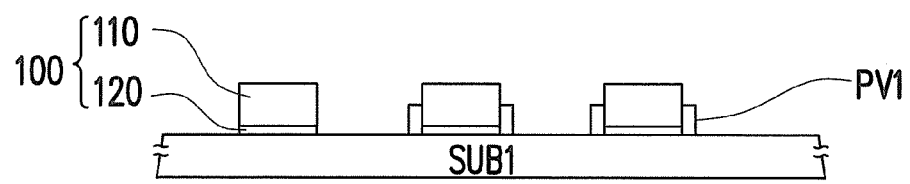
Figure 1E:
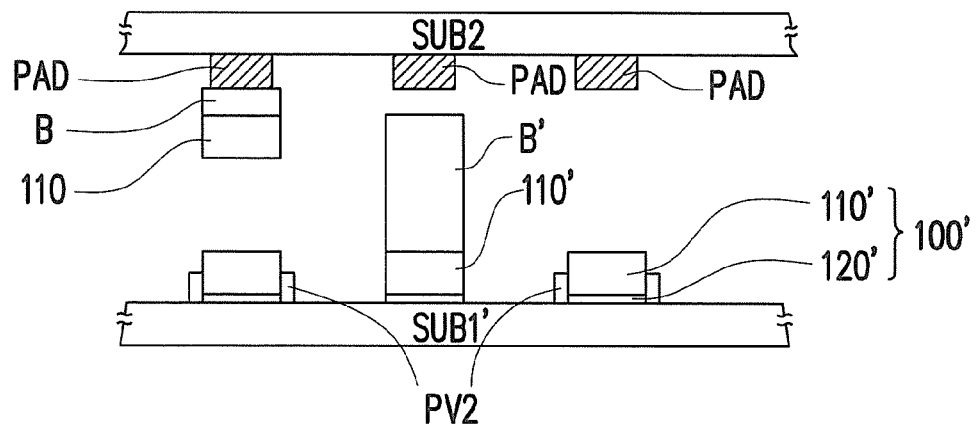
Figure 1H:
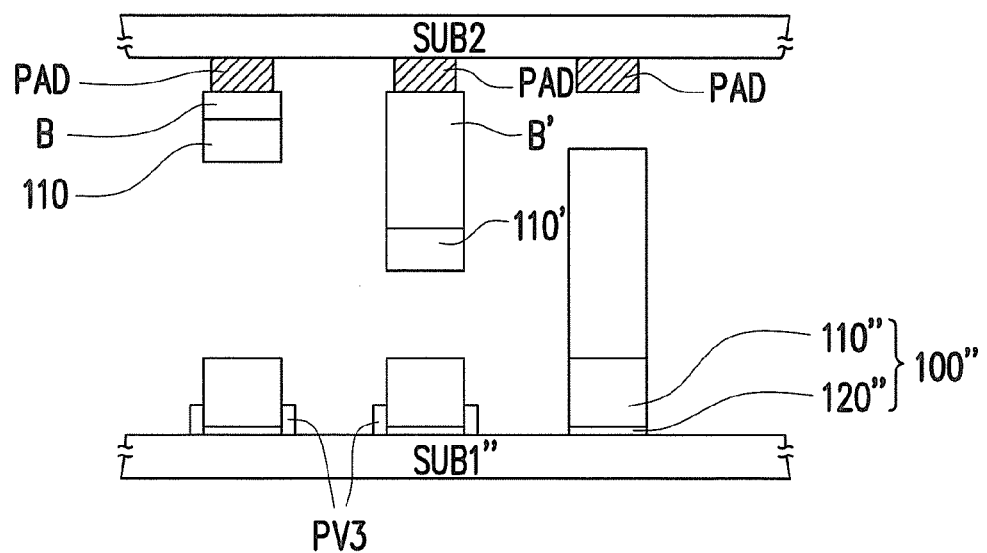

Referring to FIG. 1I, the device layers 110" uncovered by the protective layer PV" are bonded with a second substrate SUB2, and the sacrificial patterns 120" uncovered by the protective layer PV" are removed, so that parts of the device layers 110" are separated from the first substrate SUB1" and are transfer-bonded to the second substrate SUB2 (as shown in FIG. 1G). In the present embodiment, the device layer 110" uncovered by the protective layer PV" are, for example, bonded with a plurality of bonding pads PAD over the second substrate SUB2 through a plurality of conductive bumps B". For example, the conductive bumps B" are gold bumps or other alloy bumps, and the bonding between the conductive bumps B" and the bonding pads PAD over the second substrate SUB2 is achieved through reflow or other soldering process.

As shown in FIG. 1A to FIG. 1I, the device layers 110, the device layers 110' and the device layers 110" are transfer-bonded to the second substrate SUB2. In detail, a total thickness of the device layers 110 and the conductive bumps B is smaller than a total thickness of the device layers 110' and the conductive bumps B', and the total thickness of the device layers 110' and the conductive bumps B' is smaller than a total thickness of the device layers 110" and the conductive bumps B". When the total thickness of the device layers 110 and the conductive bumps B is smaller than the total thickness of the device layers 110' and the conductive bumps B', the device layers 110" during the process of transfer-bonding to the second substrate SU2B are not to be interfered by the device layers 110. When the total thickness of the device layers 110' and the conductive bumps B' is smaller than the total thickness of the device layer 110" and the conductive bumps B", the device layers 110' during the transfer-bonding process to the second substrate SU2B are not to be interfered by the device layers 110'.

Referring to FIG. 1J, in order to prevent abnormal short-circuit between the device layers 110, 110', 110", the present embodiment firstly form an insulating layer IN over the second substrate SUB2 to fill in between the device layers 110, 110', 110", and then a common electrode COM is formed on the device layers 110, 110', 110" and the insulating layer IN.

Referring to FIG. 1K, since the device layers 110, 110', 110" capable of emitting different colored lights are different in thicknesses, and the conductive bumps B、B'、B" have different heights, top surfaces of the device layers 110, 110', 110" capable of emitting different colored lights are located on different level of heights. The present embodiment is able to form a planarization layer PLN on the common electrode COM, and after the manufacturing of the planarization layer PLN is completed, the present embodiment is able to selectively form a black matrix BM and/or a micro-lens array MLA on the planarization layer PLN. For example, the black matrix BM has a plurality of openings AP, and each of the openings AP is respectively located above at least one of the device layers 110, 110', 110". In addition, the micro-lens array MLA includes a plurality of micro-lenses ML arranged in array, and each of the micro-lenses ML is respectively located above at least one of the device layers 110, 110', 110". Each of the micro-lenses ML is respectively located the openings AP therein, and is corresponded to at least one of the device layers 110, 110', 110".

Since the present embodiment adopts a coordination of the sacrificial patterns 120, 120', 120", the protective layers PV, PV', PV" and the conductive bumps B, B', B", the present embodiment is able to very efficiently transfer-bond the different device layers 110, 110', 110" to the second substrate SUB2.

Figure 2:
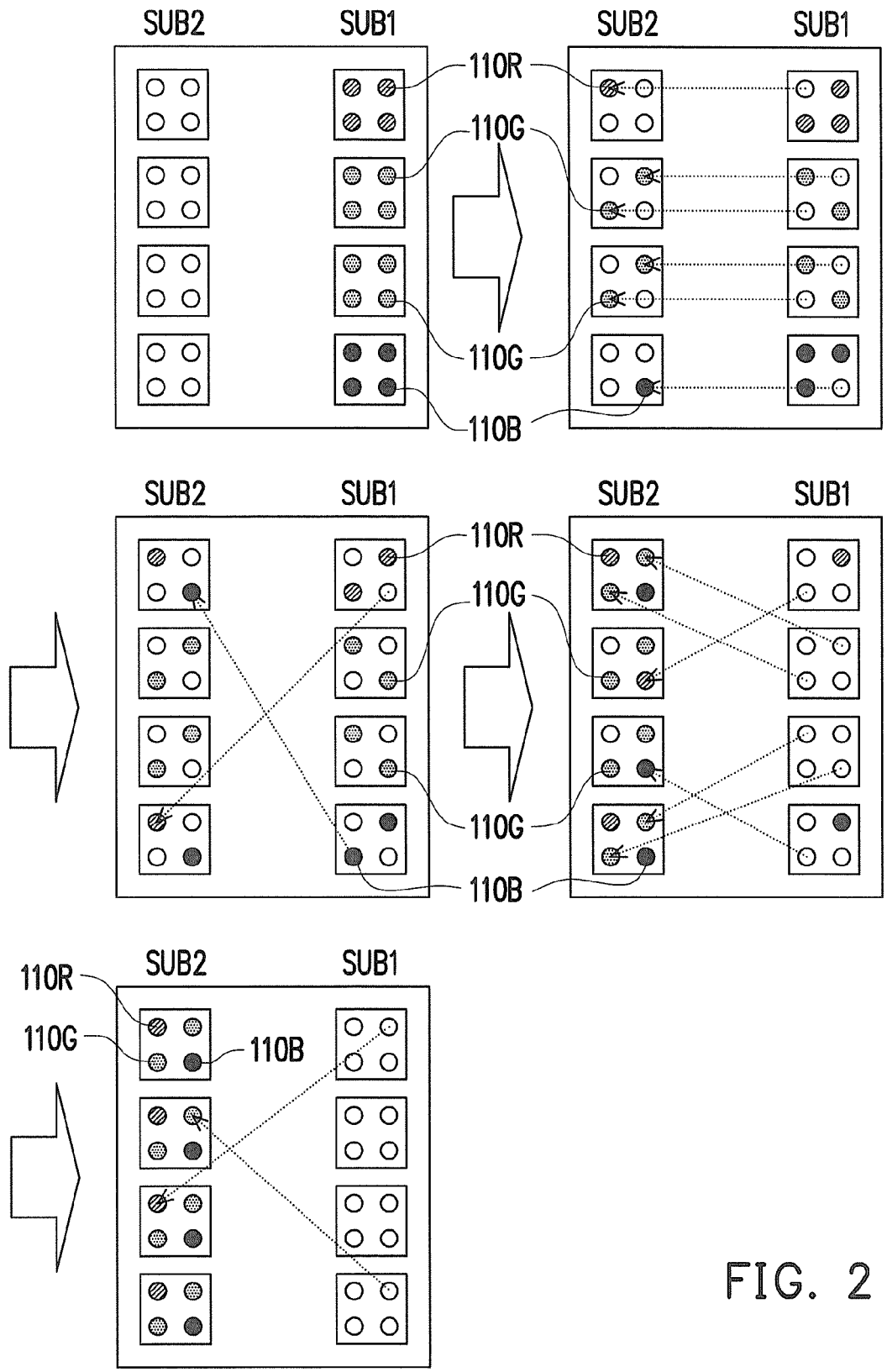
FIG. 2, FIG. 3 and FIG. 4 illustrate bonding sequences of the light emitting devices and a second substrate.
Figure 3:
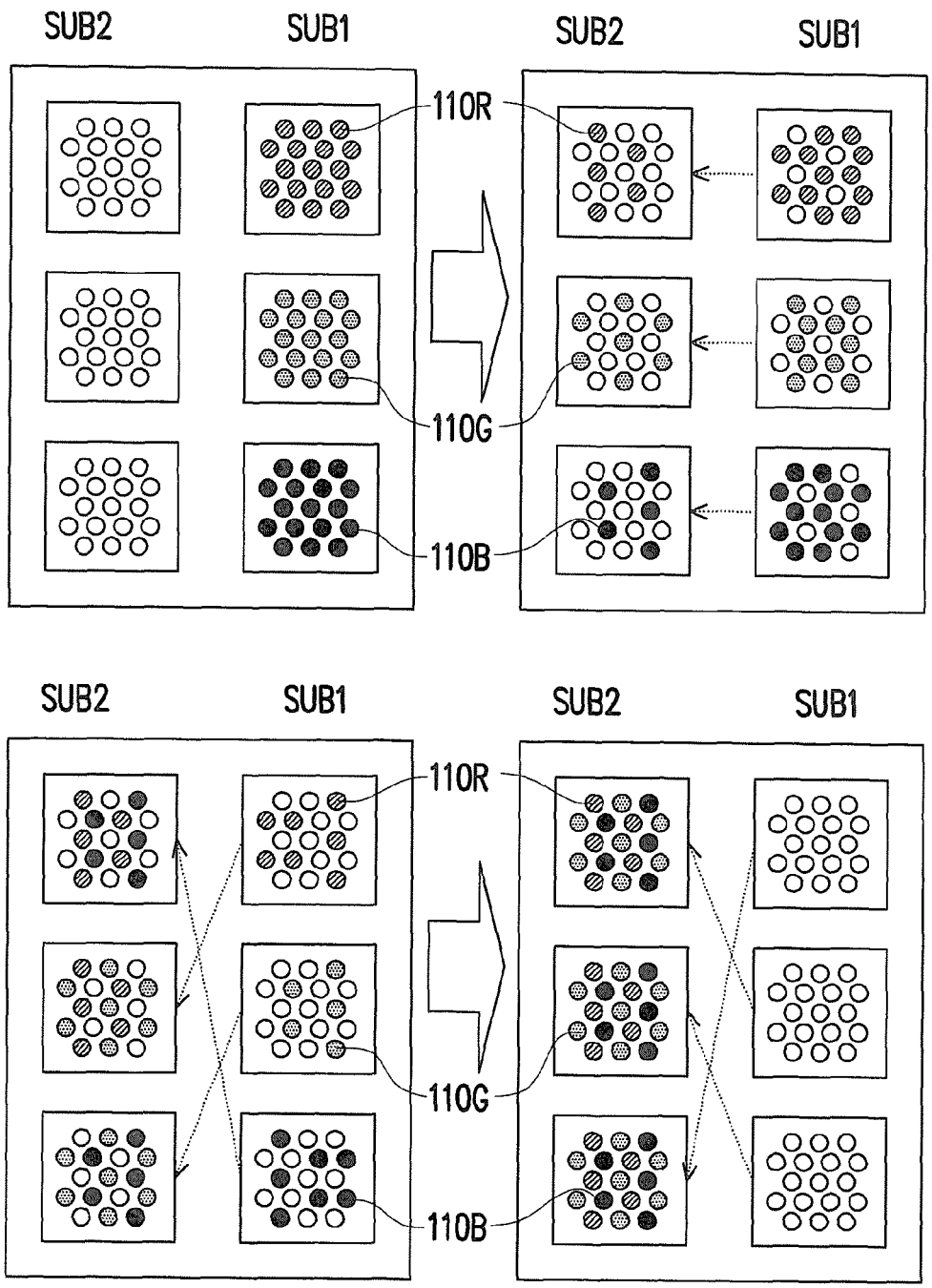
Figure 4:
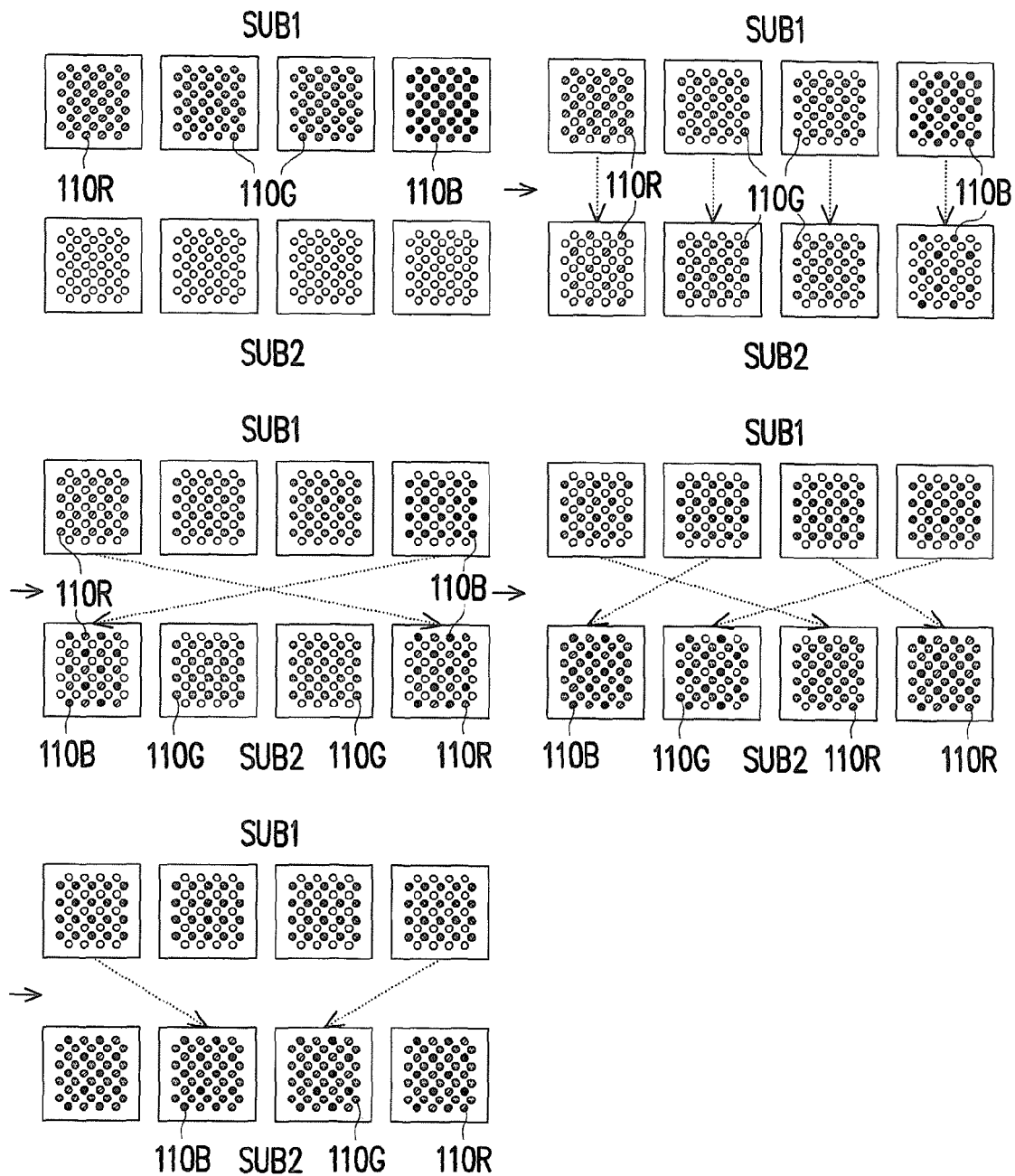

In order to transfer-bond the light emitting devices capable of emitting different colored lights to a same second substrate SUB2, the present embodiment provides the bonding sequences illustrated in FIG. 2, FIG. 3 and FIG. 4. With the bonding sequences illustrated in FIG. 2, FIG. 3 and FIG. 4, all of the light emitting devices may be smoothly transfer-bonded to the second substrate SUB2 without a problem of still remaining parts of the light emitting device over the first substrate SUB1 (or the first substrate SUB1', SUB1").

As shown in FIG. 2 to FIG. 4, firstly, three first substrates SUB1 (as shown in FIG. 3) or four first substrates SUB1 (as shown in FIG. 2 or FIG. 4) are provided, wherein one of the first substrates SUB has red light emitting devices 110R. In addition, one of the first substrates SUB1 has blue light emitting devices 110B, and the rest of the first substrates SUB1 have green light emitting devices 110G. Next, the red light emitting devices 110R, the green light emitting devices 110G and the blue light emitting devices 110B on the first substrates SUB1 are transfer-bonded to predetermined positions on the second substrates SUB2 (as shown in accordance with the dotted lines). Hence, the red light emitting devices 110R, the green light emitting devices 110G and the blue light emitting devices 110B may be rapidly and efficiently transfer-bonded from the first substrates SUB1 to the second substrates SUB2 without the problem of still remaining parts of the light emitting device over the first substrate SUB1.

Methods for Manufacturing Sacrificial Patterns

Figure 5A:
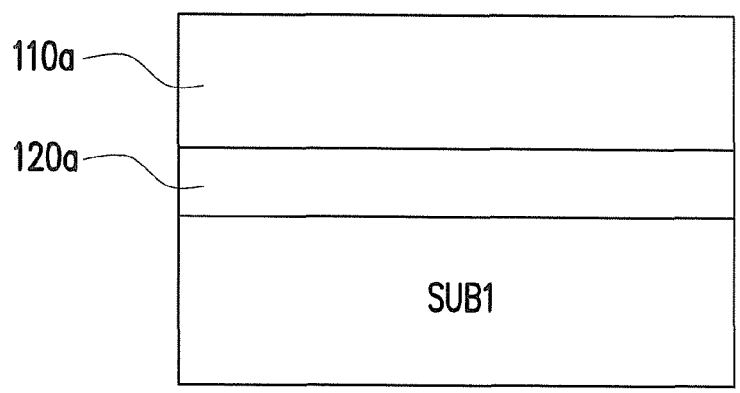
FIG. 5A to FIG. 5C illustrate a method for manufacturing interlayers.
Figure 5B:
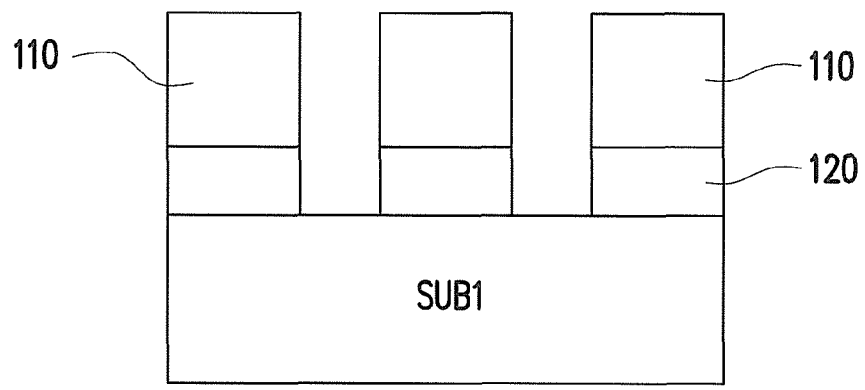
Figure 5C:
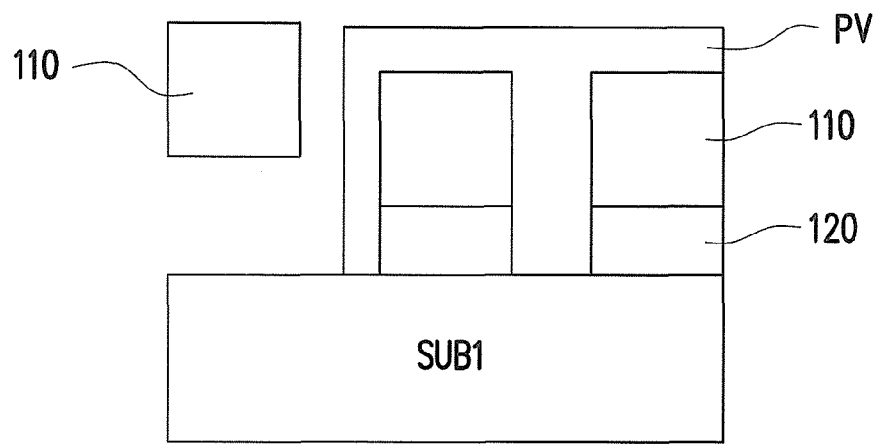

FIG. 5A to FIG. 5C illustrate a method for manufacturing sacrificial patterns. Referring to FIG. 5A, a sacrificial layer 120a and a semiconductor epitaxial layer 110a are formed on the first substrate SUB1, wherein the first substrate SUB1 is, for example, a sapphire substrate, a silicon substrate or a silicon carbide (SiC) substrate, and the sacrificial layer 120a is, for example, a zinc oxide (ZnO) epitaxial layer, a AlGaN epitaxial layer, a AlInN epitaxial layer, or so forth formed by an epitaxial process.

Referring to FIG. 5B, the semiconductor epitaxial layer 110a and the sacrificial layer 120a are patterned in order to form a plurality of device layers 110 and a plurality of sacrificial patterns 120 sandwiched between the device layers 110 and the first substrate SUB1. In the present embodiment, a process of patterning the semiconductor epitaxial layer 110a and the sacrificial layer 120a is, for example, a photolithography and etching process.

Referring to FIG. 5C, when parts of the device layers 110 are covered by the protective layer PV, the sacrificial patterns 120 uncovered by the protective layer PV may be removed by the etchant, such that the device layers 110 uncovered by the protective layer PV are separated from the first substrate SUB1. When a material of the sacrificial patterns 120 is zinc oxide, an etchant to be used includes a phosphoric acid ($H_3PO_4$), a hydrochloric acid (HCl) or other acidic solution. When a material of the sacrificial patterns 120b is AlGaN or AlInN, an etchant to be used includes a potassium hydroxide (KOH), a nitric acid ($HNO_3$) or other solution.

Figure 6A:
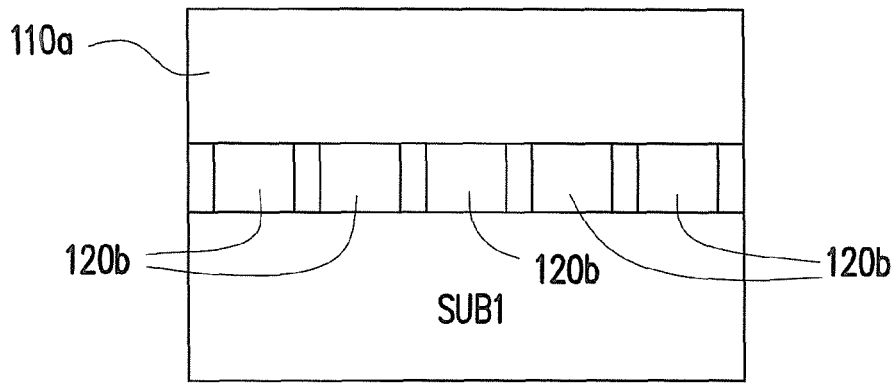
FIG. 6A to FIG. 6C illustrate another method for manufacturing interlayers.
Figure 6B:
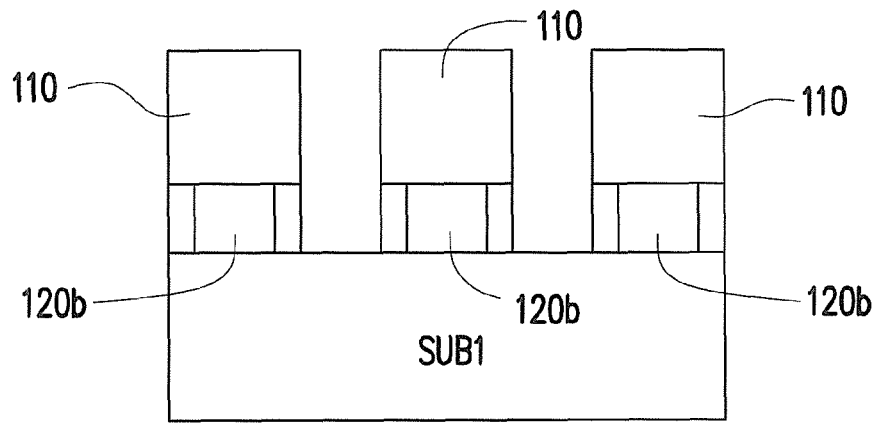
Figure 6C:
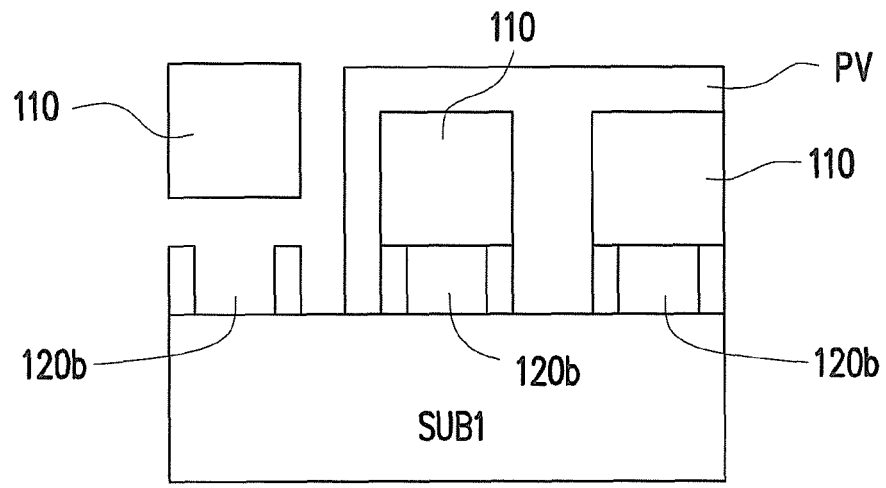

FIG. 6A to FIG. 6C illustrate another method for manufacturing sacrificial patterns. Referring to FIG. 6A, a patterned sacrificial layer 120b is firstly formed on the first substrate SUB1, and then a semiconductor epitaxial layer 110a is formed on the patterned sacrificial layer 120b and the first substrate SUB1, wherein the first substrate SUB1 is, for example, a sapphire substrate, and the patterned sacrificial layer 120b is, for example, a zinc oxide (ZnO) epitaxial layer, a AlGaN epitaxial layer, a AlInN epitaxial layer, or so forth formed through the epitaxial process.

Referring to FIG. 6B, the semiconductor epitaxial layer 110a is patterned in order to form a plurality of device layers 110 and a plurality of sacrificial patterns or sacrificial islands 120b embedded between the device layers 110 and the first substrate SUB1. In the present embodiment, the process of patterning the semiconductor epitaxial layer 110a is, for example, the photolithography and etching process.

Referring to FIG. 6C, when parts of the device layers 110 are covered by the protective layer PV, the sacrificial patterns 120b uncovered by the protective layer PV may be removed by the etchant, so that the device layers 110 uncovered by the protective layer PV can be easily separated from the first substrate SUB1. When a material of the sacrificial patterns 120b is zinc oxide, an etchant to be used includes a phosphoric acid ($H_3PO_4$), a hydrochloric acid (HCl) or other acidic solution. When a material of the sacrificial patterns 120b is AlGaN or AlInN, an etchant to be used includes a potassium hydroxide (KOH), a nitric acid ($HNO_3$) or other solution.

Second Embodiment

Figure 7A:
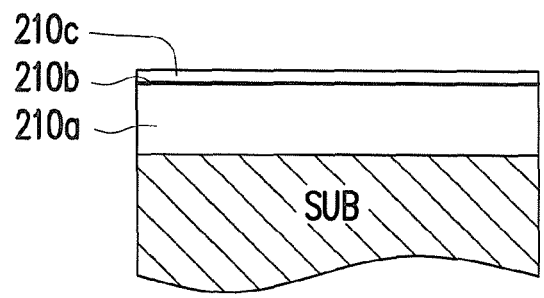
FIG. 7A to FIG. 7K are schematic flow chat diagrams illustrating a transfer-bonding method for light emitting devices according to a second embodiment.

FIG. 7A to FIG. 7K are schematic flow chat diagrams illustrating a transfer-bonding method for light emitting devices according to a second embodiment. Referring to FIG. 7A, firstly, a first type doped semiconductor layer 210a; an active layer 210b and a second type doped semiconductor layer 210c are formed on a growth substrate SUB. In the present embodiment, the first type doped semiconductor layer 210a is, for example, a N-type doped GaN epitaxial layer formed through the epitaxial process, the active layer 210b is, for example, a single or multiple quantum well light emitting layer formed through the epitaxial process, and the second type doped semiconductor layer 210c is, for example, a P-type doped GaN epitaxial layer formed through the epitaxial process. One of ordinary skilled in the art, at this point, would be able to manufacture a photonic crystal, a resonant cavity, an ohmic contact layer, and other related components based on actual design requirements, and thus no detail descriptions are elaborated in the present embodiment.

Figure 7B:
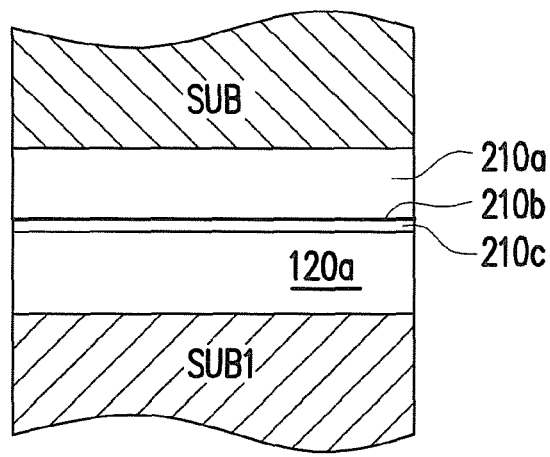

Referring to FIG. 7B, a sacrificial layer 120a is formed on a first substrate SUB1, and the second type doped semiconductor layer 210c is temporarily bonded with the sacrificial layer 120a.

Figure 7C:
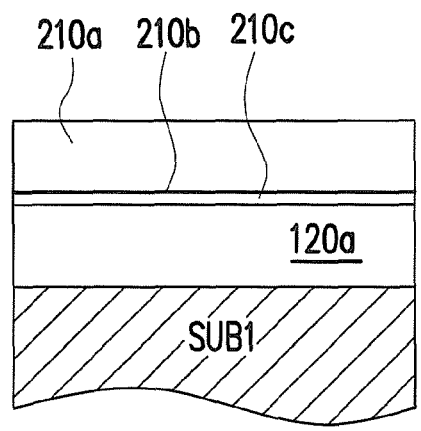

Referring to FIG. 7C, the first type doped semiconductor layer 210a and the growth substrate SUB are separated. In the present embodiment, a process of separating the first type doped semiconductor layer 210a and the growth substrate SUB includes a laser lift-off technique. In addition, one of ordinary skill in the art, after the first type doped semiconductor layer 210a and the growth substrate SUB are separated, may selectively perform a thinning process of first type doped semiconductor layer 210a (e.g., grinding or back etching), or to manufacture the photonic crystal on the first type doped semiconductor layer 210a.

Figure 7D:
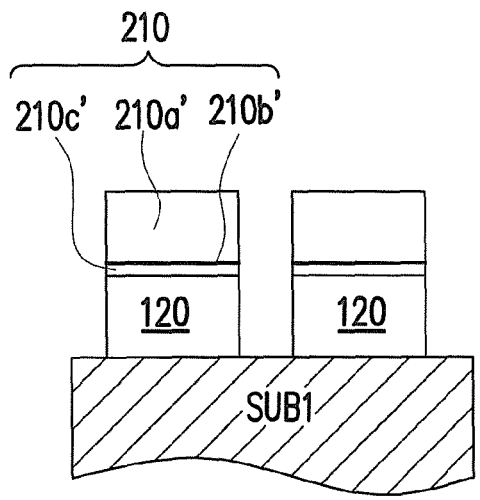

Referring to FIG. 7D, after the first type doped semiconductor layer 210a and the growth substrate SUB are separated, the first type doped semiconductor layer 210a, the active layer 210b, the second doped type semiconductor layer 210c, and the sacrificial layer 120a are patterned in order to form a plurality of first type semiconductor patterns 210a', a plurality of light-emitting patterns 210b', a plurality of second type semiconductor patterns 210c' and the sacrificial patterns 120.

Figure 7E:
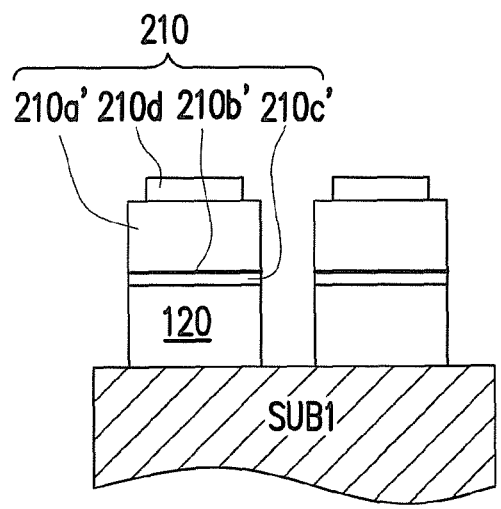

Referring to FIG. 7E, a plurality of electrodes 210d are formed over the first type semiconductor patterns 210a', wherein the first type semiconductor patterns 210a', the light-emitting patterns 210b', the second type semiconductor patterns 210c', and the electrodes 210d located on a same sacrificial pattern 120 constitute a device layer 210.

Figure 7F:
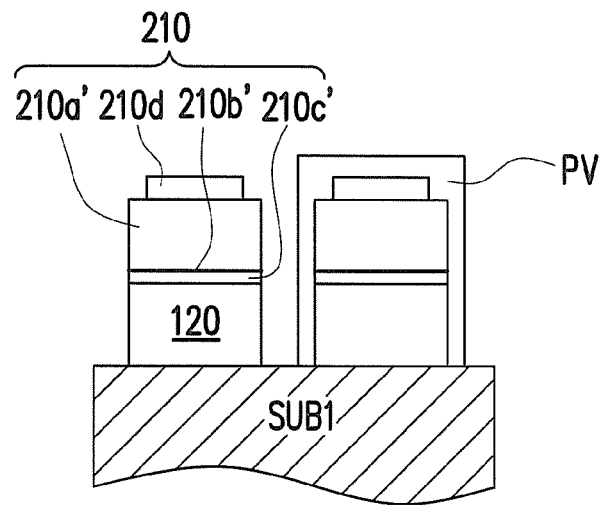

Referring to FIG. 7F, a protective layer PV is formed over the first substrate SUB1 to selectively cover parts of the device layers 210 and the sacrificial patterns 120, wherein parts of the device layers 210 and the sacrificial patterns 120 are uncovered by the protective layer PV. In the present embodiment, the protective layer PV is, for example, a photoresist material or other dielectric material, so as to ensure the device layers 210 covered by the protective layer PV are not to be separated from the first substrate SUB1 during a subsequent removal process of the sacrificial patterns 120. For example, a material of the protective layer PV may be a polyimide or other polymer material, and the material of the protective layer PV may also be a silicon oxide (SiOx), a silicon nitride (SiNx) or other inorganic dielectric material.

Figure 7G:
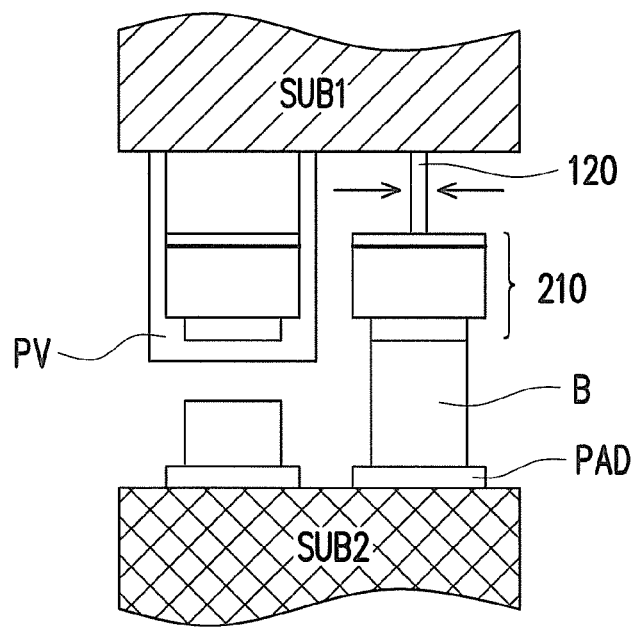

Referring to FIG. 7G, a second substrate SUB2 is provided, and the second substrate SUB2 is, for example, a circuit substrate (e.g., a complementary metal oxide semiconductor chip having a plurality of bonding pads PAD) in a monolithic micro-display. Next, the device layers 210 uncovered by the protective layer PV are bonded with the second substrate SUB2, and the sacrificial patterns 120 uncovered by the protective layer PV are removed, so that parts of the device layers 110 are separated from the first substrate SUB1 and are transfer-bonded to the second substrate SUB2. The device layer 210 uncovered by the protective layer PV are, for example, bonded the bonding pads PAD over the second substrate SUB2 through the conductive bumps B. For example, the conductive bumps B are gold bumps or other alloy bumps, and the bonding (electrical connection) between the conductive bumps B and the bonding pads PAD over the second substrate SUB2 are achieved through reflow or other soldering process.

As shown in FIG. 7G, during a process of bonding the conductive bumps B and the bonding pads PAD, the protective layer PV is able to control a distance between the first substrate SUB1 and the second substrate SUB2, so as to avoid a phenomenon of excessive press fit. In other words, the protective layer PV provides a function of bonding stop and thus a process control is easier.

Figure 7H:
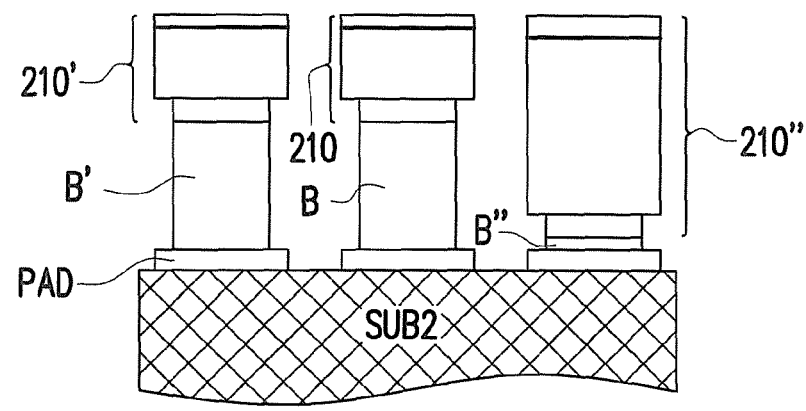

Referring to FIG. 7H, after the device layers 210 are transfer-bonded to the second substrate SUB2, one of ordinary skill in the art may selectively repeat the aforementioned steps illustrated in FIG. 7A to FIG. 7G for at least once, so as to transfer-bond the device layers 210' and the device layers 210" to the second substrate SUB2. Since the device layers 210, 210', 210" can emit different colored lights (e.g., a combination of red light, blue light, green light), the device layers 210, 210', 210" over the second substrate SUB2 can provide a function of full-color display.

As shown in FIG. 7H, since the device layers 210, 210', 210" capable of emitting different colored lights have different thicknesses, and the conductive bumps B, B', B" bonded with the device layers 210, 210', 210" also have different heights, top surfaces of the device layers 210, 210', 210" can be located on a same level of height. However, the present embodiment does not limit the top surfaces of the device layers 210, 210', 210" must be located on a same level of height, such that through adjusting the heights of the conductive bumps B, B', B", the top surfaces of the device layers 210, 210', 210" may be respectively located on different level of heights.

Figure 7I:
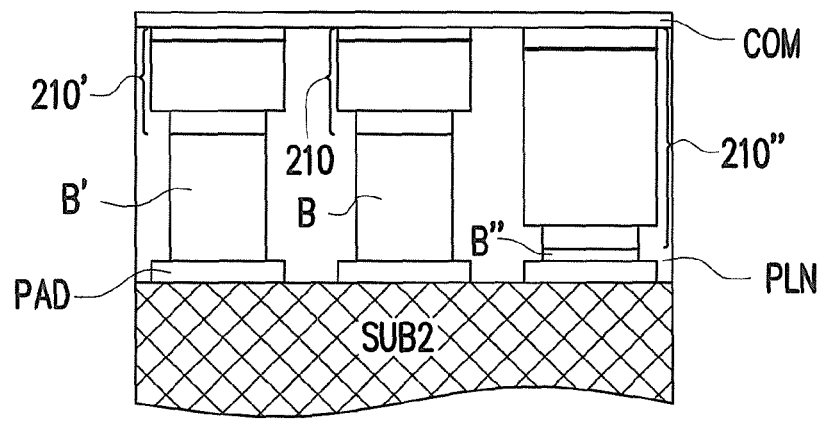
Figure 7J:
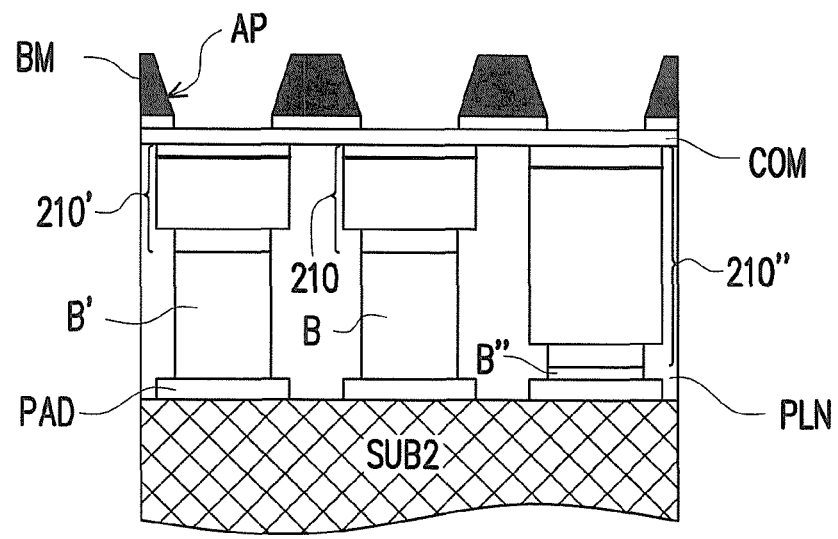

Referring to FIG. 7I and FIG. 7J, after the device layers 210, 210', 210" are all bonded with the second substrate SUB2, a planar insulating layer PLN' (as shown in FIG. 7I) are formed in between the device layers 210, 210', 210" over the second substrate SUB2, and then a common electrode COM is formed on the device layers 210, 210', 210" and the planar insulating layer PLN'. A black matrix BM is further formed on the common electrode COM, wherein the black matrix BM has a plurality of openings AP, and each of the openings AP is respectively located above one of the device layers 210, 210', 210". In the present embodiment, the black matrix BM may selectively be a good conductive shading material. Since the black matrix BM is disposed on the common electrode COM, the black matrix BM is able to further reduce a resistance of the common electrode COM in order to further enhance light emitting efficiencies of the device layers 210, 210', 210".

Figure 7K:
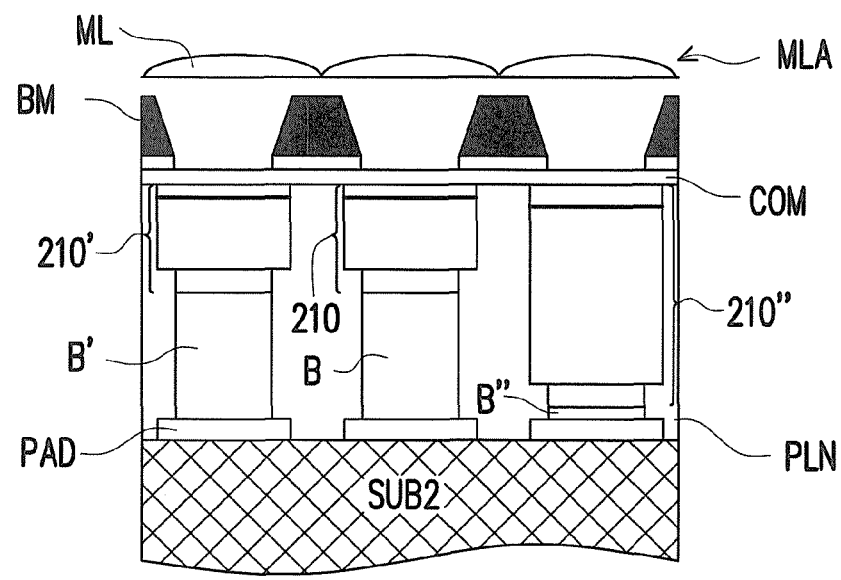

Referring to FIG. 7K, in order to further optimize optical performances of the device layers 210, 210', 210", the present embodiment is able to selectively form a micro-lens array MLA above the device layers 210, 210', 210", wherein the micro-lens array MLA includes a plurality of micro-lenses ML arranged in array, and each of the micro-lenses ML is respectively located above at least one of the device layers 210, 210', 210".

Third Embodiment

FIG. 8A to FIG. 8K are schematic flow chat diagrams illustrating a transfer-bonding method for light emitting devices according to a third embodiment. The transfer-bonding method for light emitting devices of the present embodiment is similar to the transfer-bonding method for light emitting devices of the second embodiment, except for main differences illustrated in FIG. 8B to FIG. 8H, the following is to provide detail descriptions in coordination with FIG. 8A to FIG. 8K.

Figure 8A:
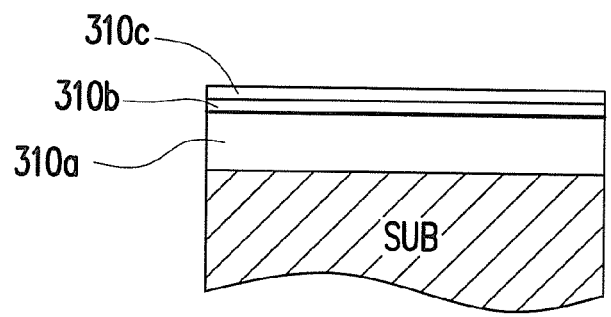
FIG. 8A to FIG. 8K are schematic flow chat diagrams illustrating a transfer-bonding method for light emitting devices according to a third embodiment.

Referring to FIG. 8A, firstly, a first type doped semiconductor layer 310a; an active layer 310b and a second type doped semiconductor layer 310c are formed on a growth substrate SUB. In the present embodiment, the first type doped semiconductor layer 310a is, for example, a N-type doped GaN epitaxial layer formed by an epitaxial process, the active layer 310b is, for example, a single or multiple quantum well light emitting layers formed through the epitaxial process, and the second type doped semiconductor layer 310c is, for example, a P-type doped GaN epitaxial layer formed through the epitaxial process. One of ordinary skill in the art would be able to manufacture a photonic crystal based on actual design requirements, and no detail descriptions are elaborated in the present embodiment.

Figure 8B:
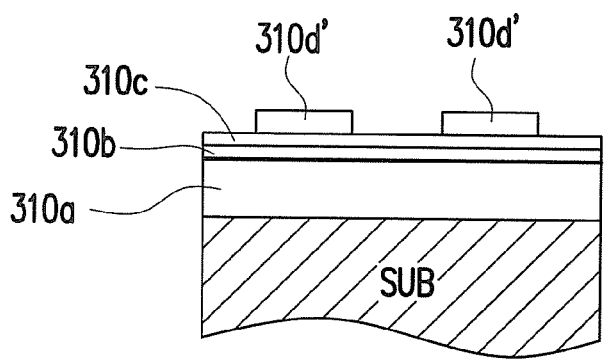

Referring to FIG. 8B, a plurality of electrodes 310d are formed over the second type doped semiconductor layer 310c, wherein the electrodes 310d and the second type doped semiconductor layer 310c have a ohmic contact in between.

Figure 8C:
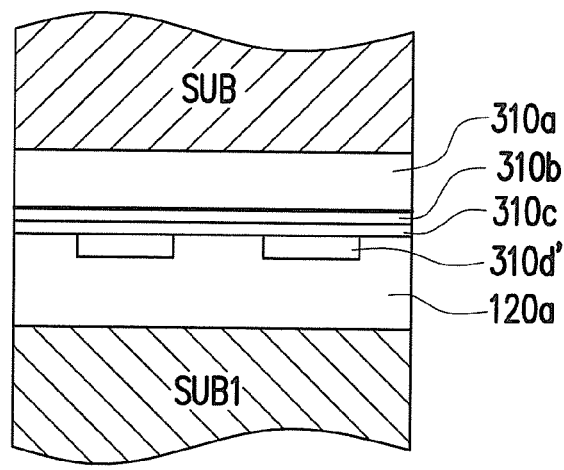

Referring to FIG. 8C, a sacrificial layer 120a is formed on the first substrate SUB1, so that the second type doped semiconductor layer 310c is temporarily bonded with the sacrificial layer 120a.

Figure 8D:
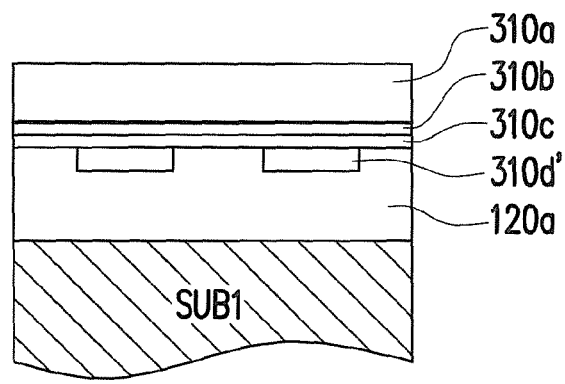

Referring to FIG. 8D, the first type doped semiconductor layer 310a are separated from the growth substrate SUB. In the present embodiment, a process of separating the first type doped semiconductor layer 310a and the growth substrate SUB includes a laser lift-off technique. In addition, one of ordinary skill in the art, after the first type doped semiconductor layer 310a and the growth substrate SUB are separated, may selectively perform a thinning process of first type doped semiconductor layer 310a (e.g., grinding or back etching), or to manufacture the photonic crystal on the first type doped semiconductor layer 310a.

Figure 8E:
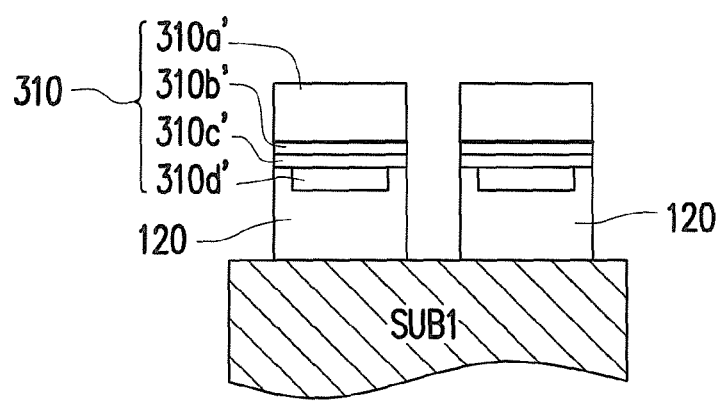

Referring to FIG. 8E, after the first type doped semiconductor layer 310a and the growth substrate SUB are separated, the first type doped semiconductor layer 310a, the active layer 310b, the second type doped semiconductor layer 310c, and the material layer 120a are patterned, in order to form a plurality of first type semiconductor patterns 310a', a plurality of light-emitting patterns 310b', a plurality of second type semiconductor patterns 310c' and the sacrificial patterns 120. Herein, the first type semiconductor patterns 310a', the light-emitting patterns 310b', the second type semiconductor patterns 310c', and the electrodes 310d located on a same sacrificial pattern 120 constitute a device layer 310.

Figure 8F:
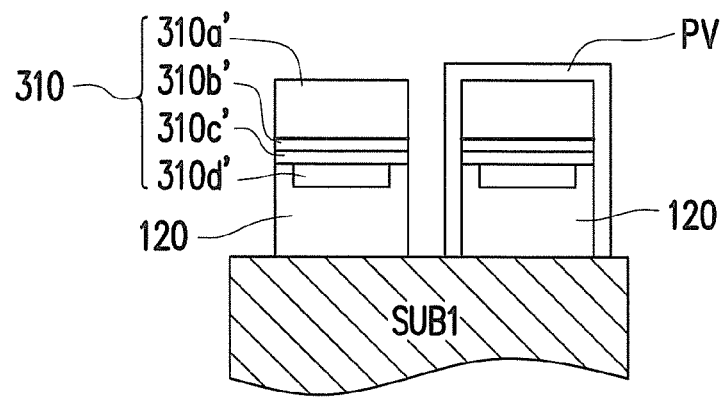

Referring to FIG. 8F, a protective layer PV is formed over the first substrate SUB1 to selectively cover parts of the device layers 310 and the sacrificial patterns 120, wherein parts of the device layers 310 and the sacrificial patterns 120 are uncovered by the protective layer PV. In the present embodiment, the protective layer PV is, for example, a photoresist material or other dielectric material, so as to ensure the device layers 310 covered by the protective layer PV are not to be separated from the first substrate SUB1 during a subsequent removal process of the sacrificial patterns 120. For example, a material of the protective layer PV may be a polyimide or other polymer material, and the material of the protective layer PV may also be a silicon oxide (SiOx), a silicon nitride (SiNx) or other inorganic dielectric material.

Figure 8G:
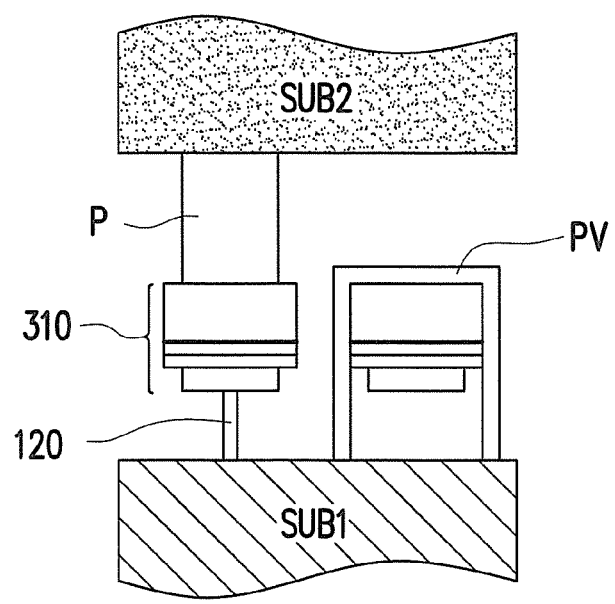

Referring to FIG. 8G, a second substrate SUB2 is provided, wherein the second substrate SUB2 is, for example, a stamp mold, and the stamp mold has a plurality of protrusions P. The protrusions P over the second substrate SUB2 are bonded with the device layers 310 uncovered by the protective layer PV. The sacrificial patterns 120 uncovered by the protective layer PV are removed, so as to transfer-bond parts of the device layers 310 to the stamp mold (SUB2).

Figure 8H:
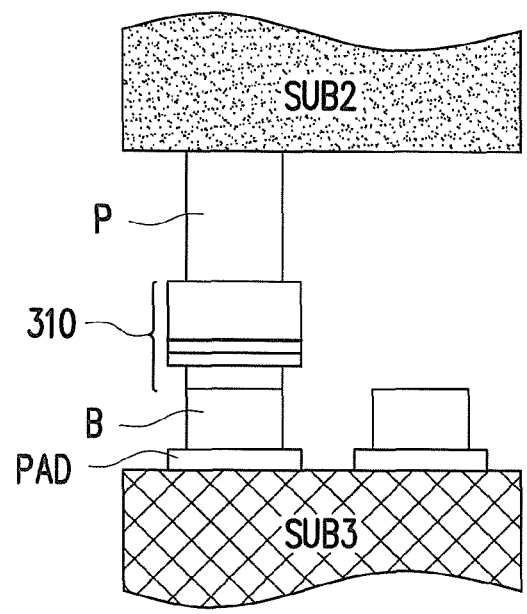

Referring to FIG. 8H, the device layers 310 transfer-bonded to the stamp mold (SUB2) are bonded with a circuit substrate SUB3 to further transfer-bond the device layers 310 to the circuit substrate SUB3, wherein the circuit substrate SUB3 is, for example, a circuit substrate (e.g., a complementary metal oxide semiconductor chip having a plurality of bonding pads PAD) in a monolithic micro-display. In the present embodiment, the device layers 310 are, for example, bonded the bonding pads PAD over the second substrate SUB2 through the conductive bumps B. For example, the conductive bumps B are gold bumps or other alloy bumps, and the bonding (electrical connection) between the conductive bumps B and the bonding pads PAD over the second substrate SUB2 are achieved through reflow or other soldering process.

Figure 8I:
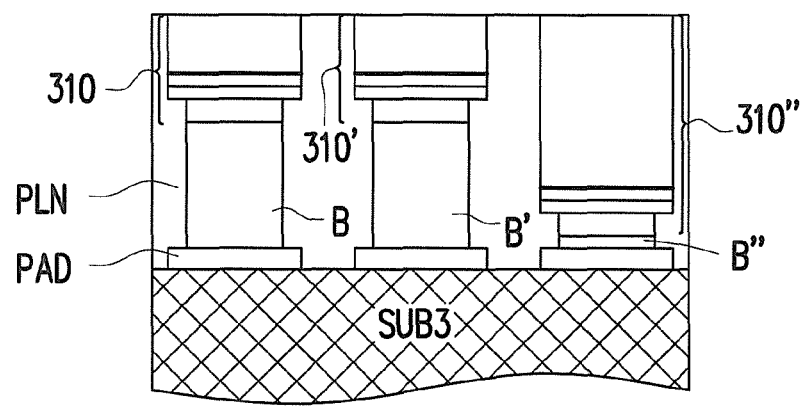

Referring to FIG. 8I, after firstly transfer-bonded the device layers 310 to the second substrate SUB2 and then to the circuit substrate SUB3, one of ordinary skill in the art may selectively repeat the aforementioned steps illustrated in FIG. 8A to FIG. 8H for at least once, so as to transfer-bond the device layers 310' and the device layers 310" to the circuit substrate SUB3.

As shown in FIG. 8H, since the device layers 310, 310', 310" capable of emitting different colored lights have different thicknesses, and the conductive bumps B, B', B" bonded with the device layers 310, 310', 310" also have different heights, top surfaces of the device layers 310, 310', 310" can be located on a same level of height. However, the present embodiment does not limit the top surfaces of the device layers 310, 310', 310" located on a same level of height, such that through adjusting the heights of the conductive bumps B, B', B", the top surfaces of the device layers 310, 310', 310" may be respectively located on different level of heights.

Figure 8J:
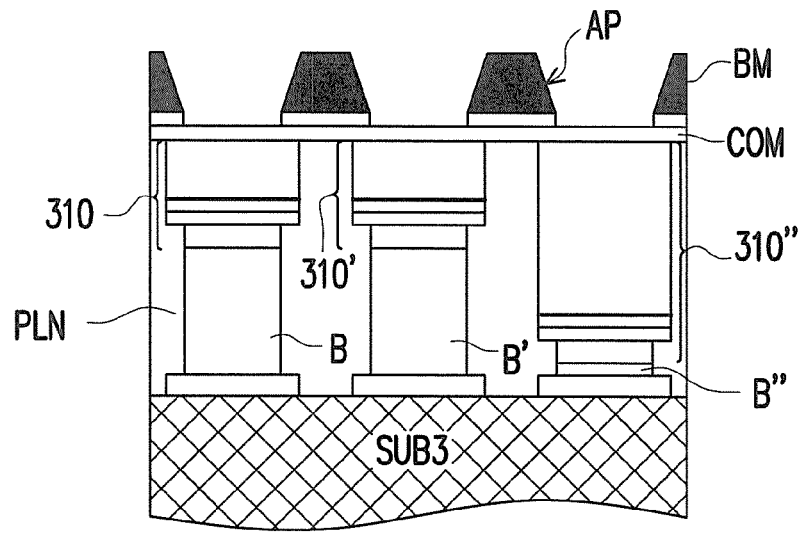
Figure 8K:
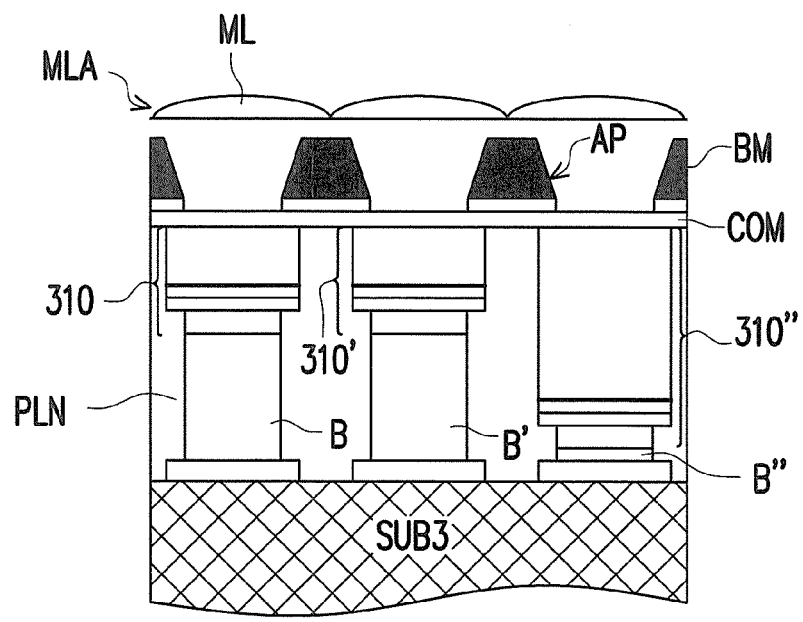

Since the manufacturing process illustrated in FIG. 8I to FIG. 8K is similar to the manufacturing process illustrated in FIG. 7I to FIG. 7K, the detail descriptions are not repeated herein.

Fourth Embodiment

Figure 9A:
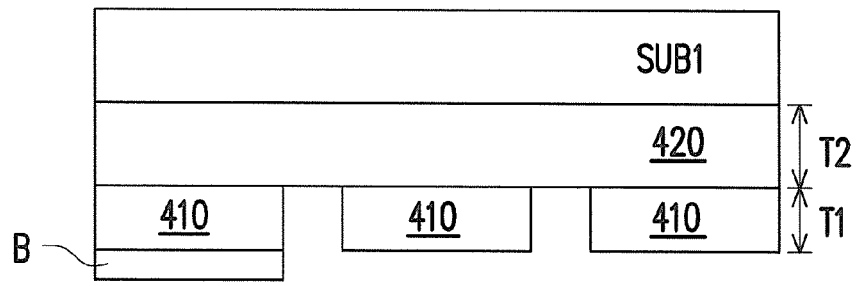
FIG. 9A to FIG. 9K are schematic flow chat diagrams illustrating a transfer-bonding method for light emitting devices according to a fourth embodiment.
Figure 9A:
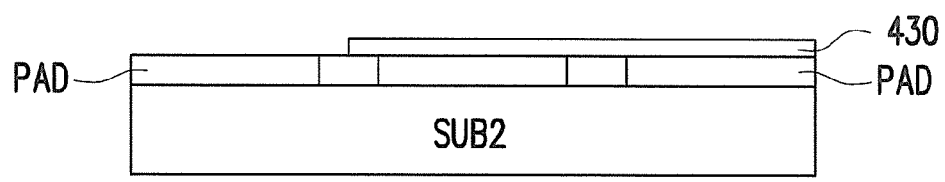
Figure 9A:
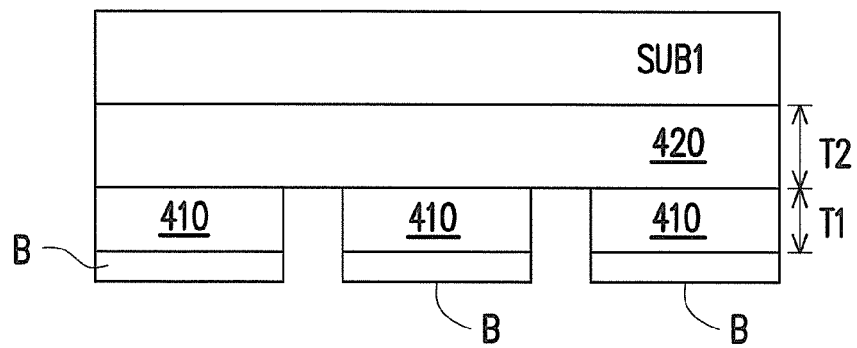
Figure 9A:
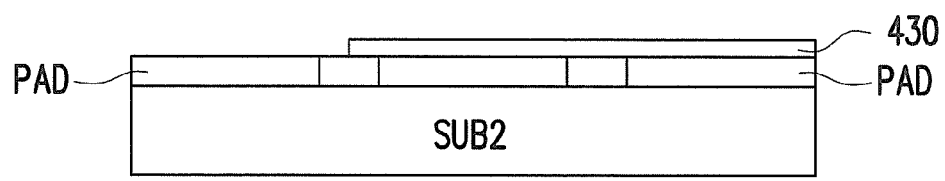

FIG. 9A to FIG. 9K are schematic flow chat diagrams illustrating a transfer-bonding method for light emitting devices according to a fourth embodiment. Referring to FIG. 9A, a first substrate SUB1 having an elastic interlayer 420 formed thereon is provided. Then, a plurality of light emitting devices 410 are arranged in array or in matrix. The light emitting devices 410 are formed over the elastic interlayer 420. A second substrate SUB2 having a mask layer 430 formed thereon are provided. The size of each light emitting device 410 is about 1 micro-meter to about 100 micro-meters. The pitch between two adjacent light emitting devices 410 can be adjusted according to actual product requirements (e.g., panel size or resolution). For example, the thickness of each of the light emitting devices 410 is T1; the thickness of the elastic interlayer 420 is T2, and 2≤(T2/T1).

As shown in FIG. 9A, an area of the second substrate SUB2 is exposed by the mask layer 430. The second substrate SUB2 comprises a plurality of bonding pads PAD formed thereon and parts of the bonding pads PAD are exposed by the mask layer 430. The position of the bonding pad PAD exposed by the mask layer 430 is corresponding to the position of the light emitting device 410 to be transferred. In other words, only the bonding pad PAD exposed by the mask layer 430 is capable of bonding with the light emitting devices 410 to be transferred. The size of the bonding pad PAD is larger than or equal to the size of the light emitting device 410. In the present embodiment, the second substrate SUB2 is, for example, a circuit substrate (e.g., a complementary metal oxide semiconductor chip having a plurality of bonding pads PAD) in a monolithic micro-display.

The mask layer 430 formed on the second substrate SUB2 is used to determine which light emitting devices 410 are selected and to be transfer-bonded to the second substrate SUB2. In other words, the mask layer 430 merely exposes parts of the bonding pads PAD so as to determine which bonding pad PAD is bonded with the light emitting devices 410. The light emitting device 410 which is corresponding to the bonding pad PAD exposed by the mask layer 430 is selected and to be transfer-bonded to the second substrate SUB2. The elastic interlayer 420 is capable of being pressed to deform and the elastic interlayer 420 has favourable elastic-resilience. For example, Young's Module (E) of the elastic interlayer 420 ranges from 640 KPa to 2 MPa. In an embodiment, the material of the elastic interlayer 420 comprises polydimethylsiloxane (PDMS). The material of the mask layer 430 comprises polyimide, silicon nitride, silicon oxide, photoresist or BCB (bisbenzocyclobutene).

As shown in FIG. 9A, a plurality of conductive bumps B are selectively formed on parts of the light emitting devices 410. In another embodiment, a plurality of conductive bumps B are formed on all of the light emitting devices 410, as shown in FIG. 9A'. In still another embodiment, a plurality of conductive bumps B are selectively formed on parts of the bonding pads PAD exposed by the mask layer 430, as shown in FIG. 9A". In FIG. 9A and FIG. 9A", although one conductive bump B is shown; however, the number of the conductive bump B is not limited thereto. For example, the conductive bumps B are gold bumps or other alloy bumps.

Figure 9B:
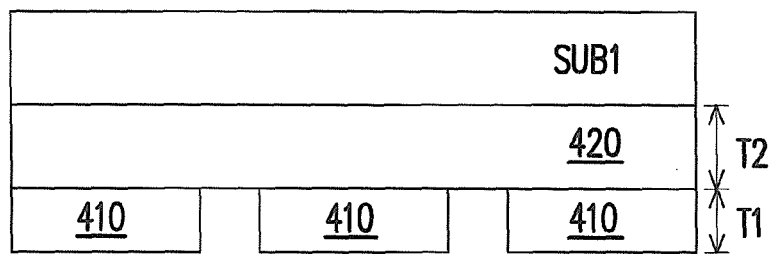
Figure 9B:
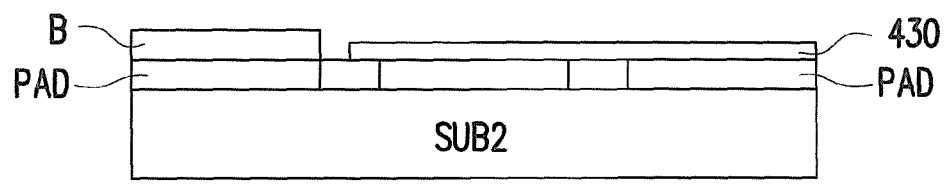
Figure 9B:
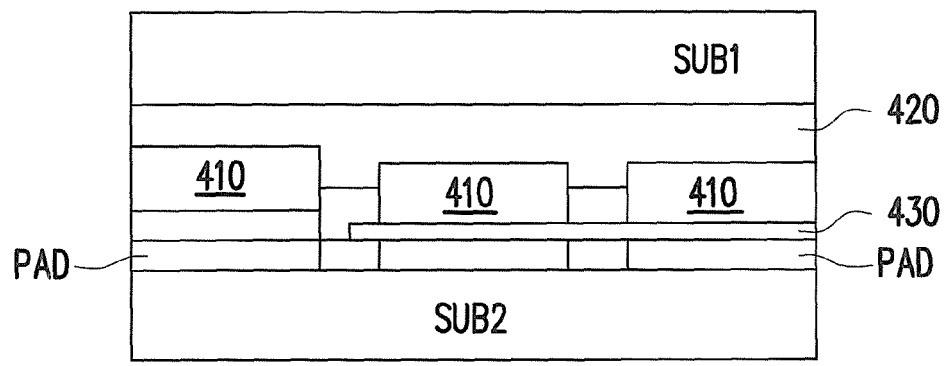

Referring to FIG. 9B, the first substrate SUB1 and the second substrate SUB2 are bonded with each other, such that parts of the light emitting devices 410 are bonded with the parts of the bonding pads PAD exposed by the mask layer 430 through the conductive bumps B. Then, the light emitting devices 410 are pressed to embedded in the elastic interlayer 420. The bonding (electrical connection) between the conductive bumps B and the bonding pads PAD of the second substrate SUB2 are achieved through reflow or other soldering process. The bonding strength between the parts of the light emitting devices 410 and the second substrate SUB2 (i.e., bonding pads PAD) is greater than the adhesion between the parts of the light emitting devices 410 and the elastic interlayer 420. When the first substrate SUB1 and the second substrate SUB2 are bonded with each other, the elastic interlayer 420 deforms and the light emitting devices 410 are pressed to embedded in the elastic interlayer 420. Due to difference between the thickness of the mask layer 430 and the height of the conductive bump B, the light emitting device 410 bonded with the bonding pad PAD is located at a higher horizontal level while the light emitting devices 410 in contact with the mask layer 430 are located at a lower horizontal level. The horizontal position difference between upper surfaces of the light emitting devices 410 is covered by the elastic interlayer 420 so as to ensure the first substrate SUB1 can be bonded with the second substrate SUB2 successfully. Accordingly, the light emitting devices 410 are protected by elastic-resilience of the elastic interlayer 420 without suffering damages.

Figure 9C:
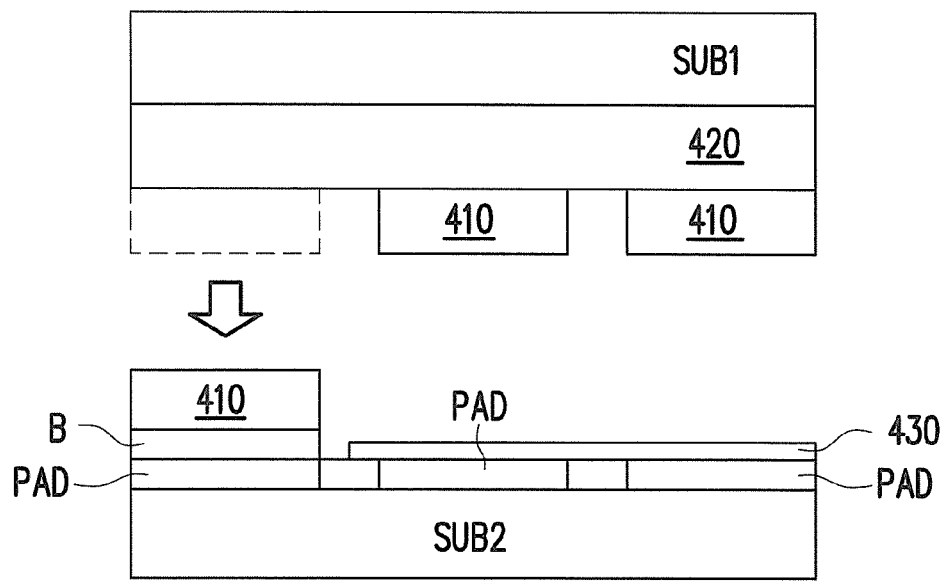

Referring to FIG. 9C, after the conductive bumps B and the bonding pads PAD of the second substrate SUB2 are bonded, the first substrate SUB1 moves away from the second substrate SUB2 and the elastic interlayer 420 is separated from the parts of the light emitting devices 410 that are bonded with the second substrate SUB2, such that the parts of the light emitting devices 410 are transfer-bonded to the second substrate SUB2 successfully. As shown in FIG. 9C, elastic-resilience of the elastic interlayer 420 occurs after the elastic interlayer 420 is separated from the parts of the light emitting devices 410 bonded with the second substrate SUB2. Thereafter, the mask layer 430 is removed from the second substrate SUB2.

Figure 9D:
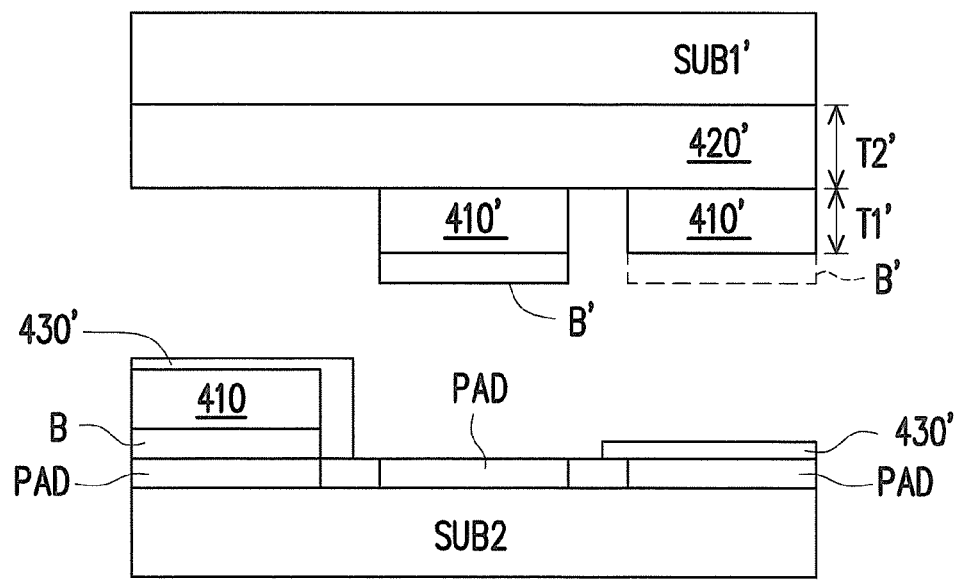

Referring to FIG. 9D, another first substrate SUB1' having an elastic interlayer 420' formed thereon is provided. Then, a plurality of light emitting devices 410' arranged in array are formed over the elastic interlayer 420'. The second substrate SUB2 having the light emitting devices 410 and a mask layer 430' formed thereon is provided. The mask layer 430' covers the light emitting devices 410 and exposes parts of the bonding pads PAD that are not bonded with the light emitting devices 410. The size of each light emitting device 410' is about 1 micro-meter to about 100 micro-meters. The pitch between two adjacent light emitting devices 410' can be adjusted according to actual product requirements (e.g., panel size or resolution). For example, the thickness of each of the light emitting devices 410' is T1', the thickness of the elastic interlayer 420' is T2', and 2≤(T2'/T1').

The mask layer 430' formed on the second substrate SUB2 is used to define which light emitting devices 410' are selected and to be transfer-bonded to the second substrate SUB2. The elastic interlayer 420' is capable of being pressed to deform and the elastic interlayer 420' has favourable elastic-resilience. For example, Young's Module (E) of the elastic interlayer 420' ranges from 640 KPa to 2 MPa. In an embodiment, the material of the elastic interlayer 420' comprises polydimethylsiloxane (PDMS). The material of the mask layer 430' comprises polyimide, silicon nitride, silicon oxide, photoresist or BCB (bisbenzocyclobutene).

As shown in FIG. 9D, a plurality of conductive bumps B' are selectively formed on parts of the light emitting devices 410' or are formed on all of the light emitting devices 410' (shown as dash line). In still another embodiment, the conductive bump B' can be formed on the exposed PAD. For example, the conductive bumps B' are gold bumps or other alloy bumps.

Figure 9E:
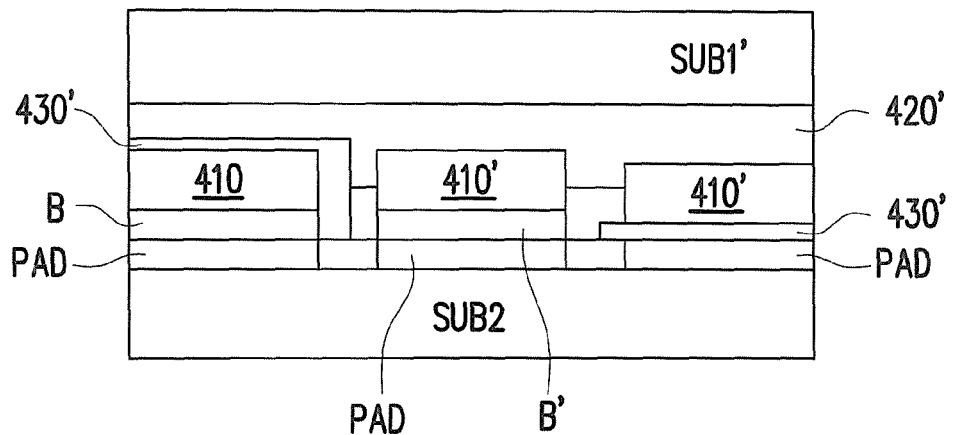

Referring to FIG. 9E, the another first substrate SUB1' and the second substrate SUB2 are bonded with each other, such that parts of the light emitting devices 410' are bonded with the parts of the bonding pads PAD exposed by the mask layer 430' and the light emitting devices 410' are pressed to embedded in the elastic interlayer 420'. The bonding (electrical connection) between the conductive bumps B' and the bonding pads PAD of the second substrate SUB2 are achieved through reflow or other soldering process. The bonding strength between the parts of the light emitting devices 410' and the second substrate SUB2 (i.e., bonding pads PAD) is greater than the adhesion between the parts of the light emitting devices 410' and the elastic interlayer 420'. When the first substrate SUB1' and the second substrate SUB2 are bonded with each other, the elastic interlayer 420' deforms and the light emitting devices 410' are pressed to embedded in the elastic interlayer 420'. Accordingly, the light emitting devices 410' are protected by elastic-resilience of the elastic interlayer 420' without suffering damages.

Figure 9F:
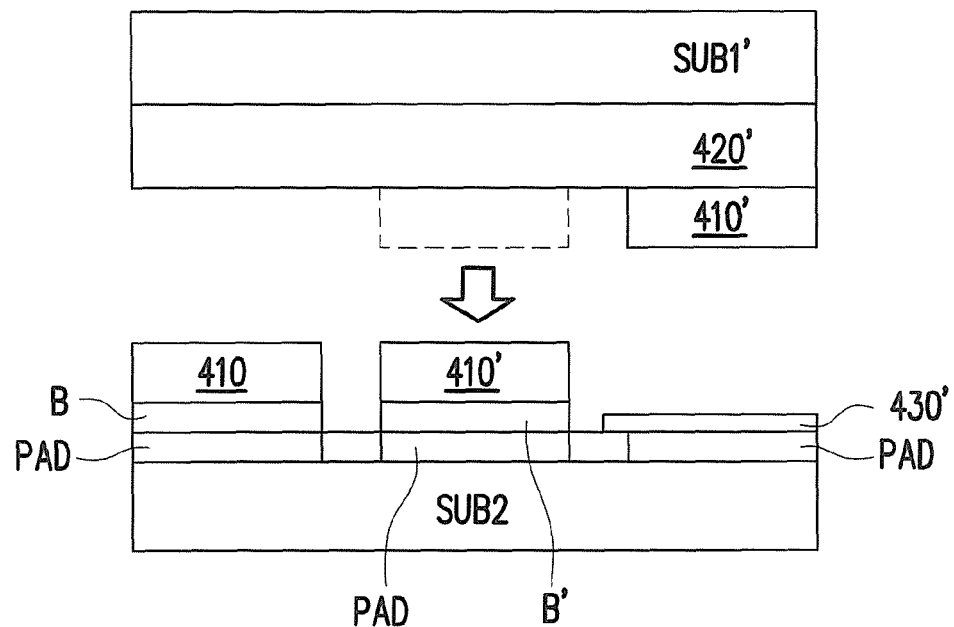

Referring to FIG. 9F, after the conductive bumps B' and the bonding pads PAD of the second substrate SUB2 are bonded, the elastic interlayer 420' is separated from the parts of the light emitting devices 410' that are bonded with the second substrate SUB2, such that the parts of the light emitting devices 410' are transfer-bonded to the second substrate SUB2 successfully. As shown in FIG. 9F, elastic-resilience of the elastic interlayer 420' occurs after the elastic interlayer 420' is separated from the parts of the light emitting devices 410' bonded with the second substrate SUB2. Thereafter, the mask layer 430' is removed from the second substrate SUB2.

Figure 9G:
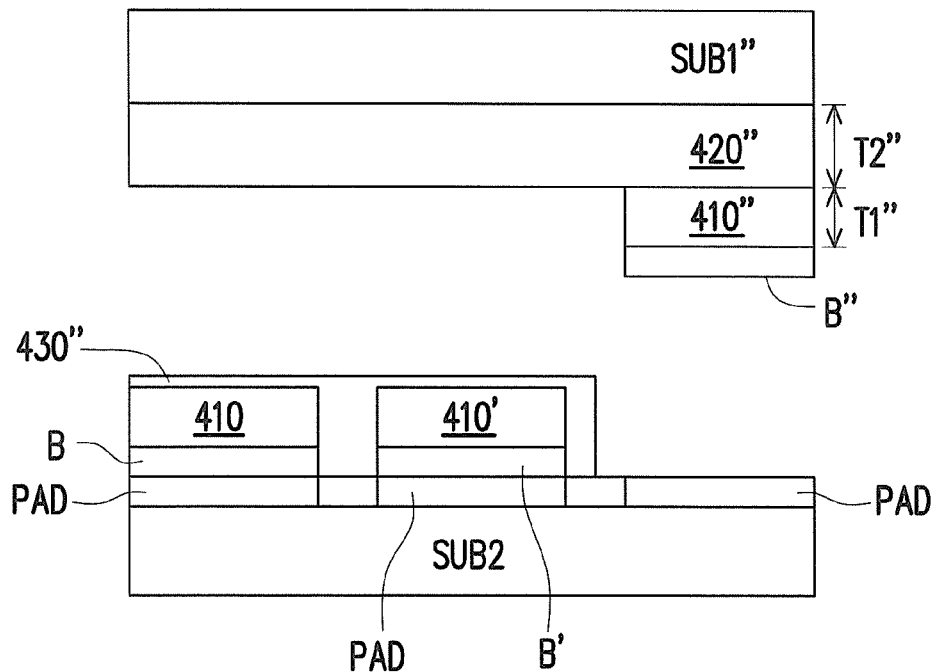

Referring to FIG. 9G, another first substrate SUB1" having an elastic interlayer 420" formed thereon is provided. Then, a plurality of light emitting devices 410" arranged in array are formed over the elastic interlayer 420". The second substrate SUB2 having the light emitting devices 410, 410' and a mask layer 430" formed thereon is provided. The mask layer 430" covers the light emitting devices 410, 410' and exposes parts of the bonding pads PAD that are not bonded with the light emitting devices 410 and 410'. The size of each light emitting device 410" is about 1 micro-meter to about 100 micro-meters. The pitch between two adjacent light emitting devices 410" can be adjusted according to actual product requirements (e.g., panel size or resolution). For example, the thickness of each of the light emitting devices 410" is T1", the thickness of the elastic interlayer 420" is T2", and 2≤(T2"/T1").

The mask layer 430" formed on the second substrate SUB2 is used to define which light emitting devices 410" are selected and to be transfer-bonded to the second substrate SUB2. The elastic interlayer 420" is capable of being pressed to deform and the elastic interlayer 420" has favourable elastic-resilience. For example, Young's Module (E) of the elastic interlayer 420" ranges from 640 KPa to 2 MPa. In an embodiment, the material of the elastic interlayer 420" comprises polydimethylsiloxane (PDMS). The material of the mask layer 430" comprises polyimide, silicon nitride, silicon oxide, photoresist or BCB (bisbenzocyclobutene).

As shown in FIG. 9G, a plurality of conductive bumps B" are selectively formed on the light emitting devices 410" or on the exposed PAD. For example, the conductive bumps B" are gold bumps or other alloy bumps.

Figure 9H:
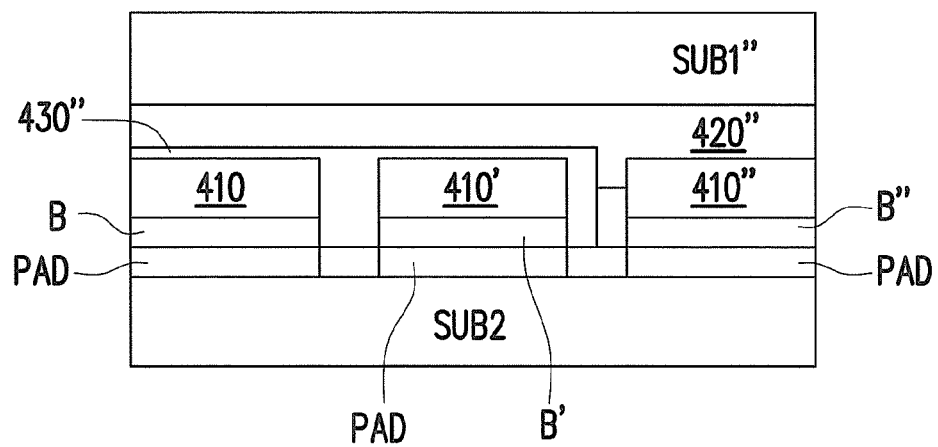

Referring to FIG. 9H, the another first substrate SUB1" and the second substrate SUB2 are bonded with each other, such that parts of the light emitting devices 410" are bonded with the parts of the bonding pads PAD exposed by the mask layer 430" and the light emitting devices 410" are pressed to embedded in the elastic interlayer 420". The bonding (electrical connection) between the conductive bumps B" and the bonding pads PAD of the second substrate SUB2 are achieved through reflow or other soldering process. The bonding strength between the parts of the light emitting devices 410" and the second substrate SUB2 (i.e., bonding pads PAD) is greater than the adhesion between the parts of the light emitting devices 410" and the elastic interlayer 420". When the first substrate SUB1" and the second substrate SUB2 are bonded with each other, the elastic interlayer 420" deforms and the light emitting devices 410" are pressed to embedded in the elastic interlayer 420". Accordingly, the light emitting devices 410" are protected by elastic-resilience of the elastic interlayer 420" without suffering damages.

Figure 9I:
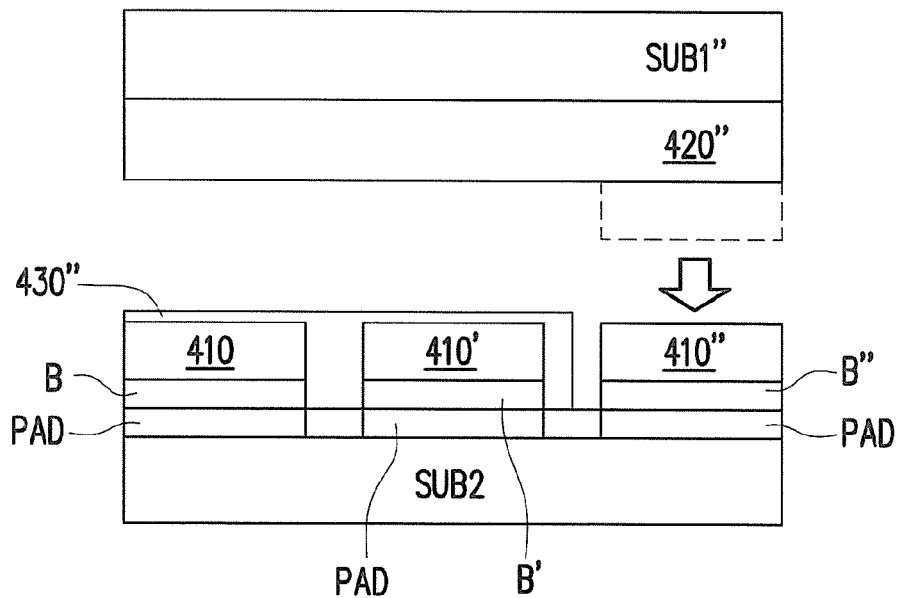

Referring to FIG. 9I, after the conductive bumps B" and the bonding pads PAD of the second substrate SUB2 are bonded, the elastic interlayer 420" is separated from the parts of the light emitting devices 410" that are bonded with the second substrate SUB2, such that the parts of the light emitting devices 410" are transfer-bonded to the second substrate SUB2 successfully. As shown in FIG. 9I, elastic-resilience of the elastic interlayer 420" occurs after the elastic interlayer 420" is separated from the parts of the light emitting devices 410" bonded with the second substrate SUB2. Thereafter, the mask layer 430" is removed from the second substrate SUB2.

Figure 9J:
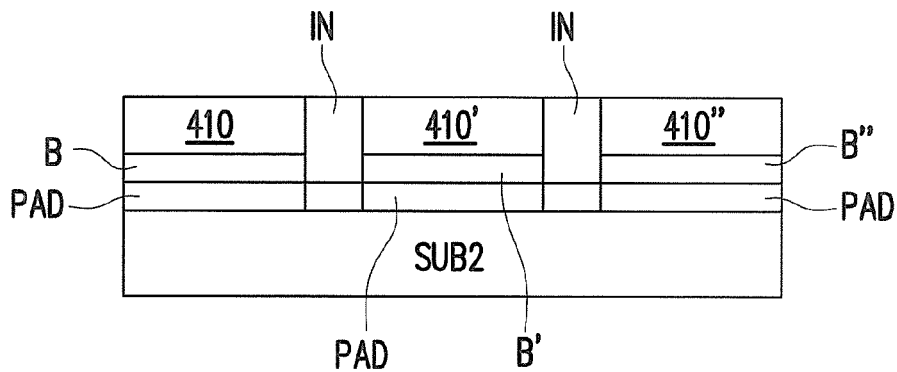
Figure 9K:
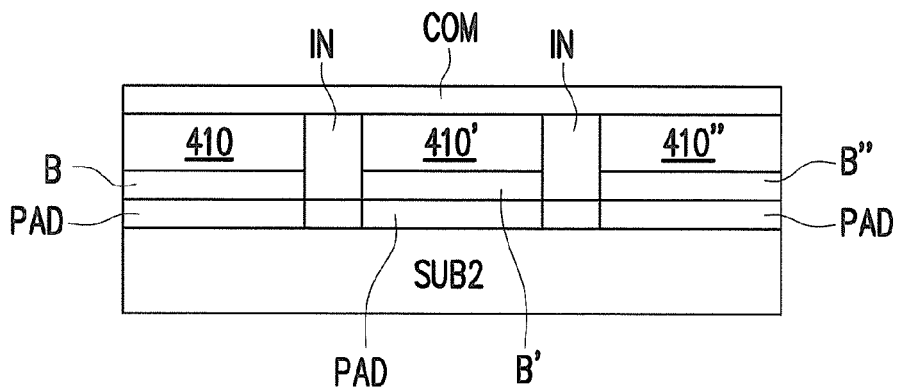

Referring to FIG. 9J and FIG. 9K, the light emitting devices 410, 410', 410" are capable of emitting different color lights. In order to prevent abnormal short-circuit between the light emitting devices 410, 410', 410", an insulating layer IN over the second substrate SUB2 to fill in between the light emitting devices 410, 410', 410". The insulating layer IN may serve as a planarization layer. Then, a common electrode COM is formed on the light emitting devices 410, 410', 410" and the insulating layer IN. Furthermore, after the manufacturing of the insulating layer IN and the common electrode COM is completed, the present embodiment is able to optionally form a black matrix and/or a micro-lens array over the common electrode COM so as to enhance optical characteristics of the light emitting devices 410, 410' and 410".

According to the aforementioned embodiments, the light emitting devices may be rapidly and efficiently transfer-bonded from a substrate to another substrate, so as to facilitate an application of the light emitting devices in the field of micro-display.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A transfer-bonding method for light emitting devices comprising:
    (a) providing a first substrate having an elastic interlayer formed thereon and forming a plurality of light emitting devices arranged in array over the elastic interlayer;
    (b) providing a second substrate having a mask layer formed thereon, wherein an area of the second substrate is exposed by the mask layer;
    (c) bonding the first substrate and the second substrate, such that parts of the light emitting devices are bonded with the area of the second substrate exposed by the mask layer and the light emitting devices are pressed to embedded in the elastic interlayer by the second substrate, wherein a bonding strength between the parts of the light emitting devices and the second substrate is greater than an adhesion between the parts of the light emitting devices and the elastic interlayer; and
    (d) separating the elastic interlayer from the parts of the light emitting devices bonded with the second substrate, such that the parts of the light emitting devices are transfer-bonded to the second substrate.

2. The transfer-bonding method for light emitting devices as recited in claim 1, wherein Young's Module (E) of the elastic interlayer ranges from 640 KPa to 2 MPa.

3. The transfer-bonding method for light emitting devices as recited in claim 1, wherein a material of the elastic interlayer comprises polydimethylsiloxane (PDMS).

4. The transfer-bonding method for light emitting devices as recited in claim 1, wherein a thickness of each of the light emitting devices is T1, a thickness of the elastic interlayer is T2, and 2≤(T2/T1).

5. The transfer-bonding method for light emitting devices as recited in claim 1, wherein the second substrate comprises a plurality of bonding pads formed thereon and parts of the bonding pads are exposed by the mask layer.

6. The transfer-bonding method for light emitting devices as recited in claim 5, wherein the size of the bonding pad is larger than or equal to the size of the light emitting devices.

7. The transfer-bonding method for light emitting devices as recited in claim 5, further comprising:
    before bonding the first substrate and the second substrate, forming a plurality of conductive bumps over the bonding pads exposed by the mask layer.

8. The transfer-bonding method for light emitting devices as recited in claim 7, wherein parts of the light emitting devices are bonded to the exposed area of the second substrate through the conductive bumps.

9. The transfer-bonding method for light emitting devices as recited in claim 5, wherein parts of the light emitting devices are bonded with the bonding pad uncovered by the mask layer when parts of the light emitting devices are bonded with the area of the second substrate exposed by the mask layer.

10. The transfer-bonding method for light emitting devices as recited in claim 9, the light emitting device bonded with the bonding pad is located at a higher horizontal level while the light emitting devices in contact with the mask layer are located at a lower horizontal level.

11. The transfer-bonding method for light emitting devices as recited in claim 1, wherein a material of the mask layer comprises polyimide, silicon nitride, silicon oxide, photoresist or BCB (bisbenzocyclobutene).

12. The transfer-bonding method for light emitting devices as recited in claim 1, wherein the elastic interlayer deforms when the light emitting devices are pressed and are embedded in the elastic interlayer.

13. The transfer-bonding method for light emitting devices as recited in claim 1, wherein elastic-resilience of the elastic interlayer occurs after the elastic interlayer is separated from the parts of the light emitting devices bonded with the second substrate.

14. The transfer-bonding method for light emitting devices as recited in claim 1, further comprising:
    before bonding the first substrate and the second substrate, forming a plurality of conductive bumps over the light emitting devices.

15. The transfer-bonding method for light emitting devices as recited in claim 14, the conductive bumps are formed over at least part of the light emitting devices.

16. The transfer-bonding method for light emitting devices as recited in claim 1, further comprising:
    repeating the step (a) to the step (d) at least one time to transfer light emitting devices capable of emitting different color from different first substrates to the second substrate.

17. The transfer-bonding method for light emitting devices as recited in claim 1, wherein the size of light emitting devices are about 1 micro-meter to about 100 micro-meters.

* * * * *